US009035314B2

(12) United States Patent
Yamazaki et al.

(10) Patent No.: US 9,035,314 B2
(45) Date of Patent: May 19, 2015

(54) METHOD FOR MANUFACTURING AN ELECTROOPTICAL DEVICE

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 372 days.

(21) Appl. No.: 13/438,875

(22) Filed: Apr. 4, 2012

(65) Prior Publication Data
US 2012/0187837 A1    Jul. 26, 2012

Related U.S. Application Data

(60) Continuation of application No. 11/204,000, filed on Aug. 16, 2005, now abandoned, and a division of application No. 09/533,175, filed on Mar. 22, 2000, now Pat. No. 6,936,844.

(30) Foreign Application Priority Data

Mar. 26, 1999    (JP) .................................. 11-084736

(51) Int. Cl.
*H01L 29/786*    (2006.01)
*H01L 27/28*    (2006.01)
(Continued)

(52) U.S. Cl.
CPC ...... *G02F 1/13454* (2013.01); *G02F 1/136213* (2013.01); *H01L 29/4908* (2013.01); *H01L 2924/0002* (2013.01); *H01L 27/124* (2013.01)

(58) Field of Classification Search
CPC . H01L 27/13; H01L 27/1255; H01L 27/3258; H01L 51/5012
USPC .................. 257/59, 72, E29.273; 438/30, 34; 349/42
See application file for complete search history.

(56) References Cited

U.S. PATENT DOCUMENTS 4,348,746 A    9/1982    Okabayashi et al.
5,153,754 A    10/1992    Whetten
(Continued)

FOREIGN PATENT DOCUMENTS

EP    0 544 229 A1    6/1993
EP    0 645 802 A2    3/1995
(Continued)

OTHER PUBLICATIONS

T. Zhao et al., "A Novel Floating Gate Spacer Polysilicon TFT," IEDM 93: Technical Digest of International Electron Devices Meeting, 1993, pp. 393-396, Center for Integrated Systems, Stanford University.
(Continued)

*Primary Examiner* — Marvin Payen
*Assistant Examiner* — Jeremy Joy
(74) *Attorney, Agent, or Firm* — Nixon Peabody LLP; Jeffrey L. Costellia

(57) ABSTRACT

An object of the present invention is to provide an electrooptical device having high operation performance and reliability, and a method of manufacturing the electrooptical device. Lov region 207 is disposed in n-channel TFT 302 that comprises a driver circuit, and a TFT structure which is resistant to hot carriers is realized. Loff regions 217 to 220 are disposed in n-channel TFT 304 that comprises a pixel section, and a TFT structure of low off current is realized. An input-output signal wiring 305 and gate wiring 306 are formed by laminating a first wiring and a second wiring having lower resistivity than the first wiring, and wiring resistivity is steeply reduced.

24 Claims, 21 Drawing Sheets

(51) Int. Cl.
*H01L 27/12* (2006.01)
*G02F 1/13* (2006.01)
*G02F 1/1345* (2006.01)
*H01L 29/49* (2006.01)
*G02F 1/1362* (2006.01)

(56) References Cited

U.S. PATENT DOCUMENTS

| | | | | |
|---|---|---|---|---|
| 5,182,620 | A | * | 1/1993 | Shimada et al. ............ 257/72 |
| 5,210,435 | A | | 5/1993 | Roth et al. |
| 5,247,198 | A | | 9/1993 | Homma et al. |
| 5,283,455 | A | | 2/1994 | Inoue et al. |
| 5,323,042 | A | | 6/1994 | Matsumoto |
| 5,359,206 | A | | 10/1994 | Yamamoto et al. |
| 5,444,557 | A | * | 8/1995 | Spitzer et al. ............ 349/42 |
| 5,576,225 | A | | 11/1996 | Zhang et al. |
| 5,594,569 | A | | 1/1997 | Konuma et al. |
| 5,623,157 | A | | 4/1997 | Miyazaki et al. |
| 5,643,826 | A | | 7/1997 | Ohtani et al. |
| 5,670,795 | A | * | 9/1997 | Ikeda ............ 257/72 |
| 5,693,959 | A | | 12/1997 | Inoue et al. |
| 5,712,495 | A | * | 1/1998 | Suzawa ............ 257/49 |
| 5,767,930 | A | | 6/1998 | Kobayashi et al. |
| 5,804,878 | A | | 9/1998 | Miyazaki et al. |
| 5,815,223 | A | * | 9/1998 | Watanabe et al. ............ 349/42 |
| 5,818,557 | A | | 10/1998 | Konuma et al. |
| 5,880,038 | A | * | 3/1999 | Yamazaki et al. ............ 438/756 |
| 5,923,962 | A | | 7/1999 | Ohtani et al. |
| 6,016,174 | A | * | 1/2000 | Endo et al. ............ 349/43 |
| 6,049,092 | A | | 4/2000 | Konuma et al. |
| 6,063,675 | A | | 5/2000 | Rodder |
| 6,088,071 | A | * | 7/2000 | Yamamoto et al. ............ 349/38 |
| 6,100,947 | A | * | 8/2000 | Katayama ............ 349/38 |
| 6,114,715 | A | * | 9/2000 | Hamada ............ 257/72 |
| 6,124,604 | A | * | 9/2000 | Koyama et al. ............ 257/72 |
| 6,165,824 | A | | 12/2000 | Takano et al. |
| 6,235,112 | B1 | | 5/2001 | Seiki et al. |
| 6,255,705 | B1 | * | 7/2001 | Zhang et al. ............ 257/412 |
| 6,274,887 | B1 | * | 8/2001 | Yamazaki et al. ............ 257/72 |
| 6,285,042 | B1 | | 9/2001 | Ohtani et al. |
| 6,288,764 | B1 | * | 9/2001 | Zhang et al. ............ 349/152 |
| 6,306,694 | B1 | | 10/2001 | Yamazaki et al. |
| 6,307,214 | B1 | * | 10/2001 | Ohtani et al. ............ 257/59 |
| 6,320,204 | B1 | * | 11/2001 | Hirabayashi et al. ............ 257/71 |
| 6,335,541 | B1 | | 1/2002 | Ohtani et al. |
| 6,380,007 | B1 | * | 4/2002 | Koyama ............ 438/151 |
| 6,417,898 | B1 | * | 7/2002 | Izumi ............ 349/73 |
| 6,469,317 | B1 | | 10/2002 | Yamazaki et al. |
| 6,479,333 | B1 | | 11/2002 | Takano et al. |
| 6,518,700 | B1 | * | 2/2003 | Friend et al. ............ 313/504 |
| 6,524,895 | B2 | | 2/2003 | Yamazaki et al. |
| 6,542,137 | B2 | * | 4/2003 | Kimura et al. ............ 345/76 |
| 6,576,924 | B1 | | 6/2003 | Yamazaki et al. |
| 6,576,926 | B1 | | 6/2003 | Yamazaki et al. |
| 6,618,029 | B1 | * | 9/2003 | Ozawa ............ 345/82 |
| 6,630,687 | B1 | | 10/2003 | Koyama et al. |
| 6,777,254 | B1 | | 8/2004 | Yamazaki et al. |
| 6,777,716 | B1 | | 8/2004 | Yamazaki et al. |
| 6,784,037 | B2 | | 8/2004 | Yamazaki et al. |
| 6,867,431 | B2 | | 3/2005 | Konuma et al. |
| 6,893,503 | B1 | | 5/2005 | Ohnuma et al. |
| 6,936,844 | B1 | | 8/2005 | Yamazaki et al. |
| 6,952,020 | B1 | | 10/2005 | Yamazaki et al. |
| 6,967,129 | B2 | | 11/2005 | Yamazaki et al. |
| 6,977,394 | B2 | | 12/2005 | Yamazaki et al. |
| 6,998,639 | B2 | | 2/2006 | Ohtani et al. |
| 7,102,169 | B2 | | 9/2006 | Koyama et al. |
| 7,227,603 | B1 | | 6/2007 | Konuma et al. |
| 7,323,717 | B2 | | 1/2008 | Koyama et al. |
| 7,365,393 | B2 | | 4/2008 | Yamazaki et al. |
| 7,381,599 | B2 | | 6/2008 | Konuma et al. |
| 7,417,253 | B2 | | 8/2008 | Yamazaki et al. |
| 7,442,991 | B2 | | 10/2008 | Yamazaki et al. |
| 7,525,158 | B2 | | 4/2009 | Konuma et al. |
| 7,550,325 | B2 | | 6/2009 | Koyama et al. |
| 7,569,856 | B2 | | 8/2009 | Konuma et al. |
| 7,745,829 | B2 | | 6/2010 | Yamazaki et al. |
| 7,863,622 | B2 | | 1/2011 | Yamazaki et al. |
| 8,030,659 | B2 | | 10/2011 | Yamazaki et al. |
| 2005/0269639 | A1 | | 12/2005 | Yamazaki et al. |
| 2006/0131583 | A1 | | 6/2006 | Ohtani et al. |
| 2007/0236647 | A1 | | 10/2007 | Konuma et al. |
| 2009/0231533 | A1 | | 9/2009 | Koyama et al. |
| 2009/0289254 | A1 | | 11/2009 | Konuma et al. |
| 2012/0007095 | A1 | | 1/2012 | Yamazaki et al. |

FOREIGN PATENT DOCUMENTS

| | | |
|---|---|---|
| EP | 0 651 431 | 5/1995 |
| EP | 0 683 525 A1 | 11/1995 |
| EP | 0 738 012 A2 | 10/1996 |
| EP | 0 838 849 A2 | 4/1998 |
| EP | 1 041 641 A2 | 10/2000 |
| EP | 1 158 580 A2 | 11/2001 |
| EP | 1 564 799 A2 | 8/2005 |
| EP | 1 564 800 A2 | 8/2005 |
| JP | 05-142577 | 6/1993 |
| JP | 5-153754 | 6/1993 |
| JP | 06-088972 | 3/1994 |
| JP | 7-130652 | 5/1995 |
| JP | 07-169974 | 7/1995 |
| JP | 07-318978 | 12/1995 |
| JP | 8-87248 | 4/1996 |
| JP | 08-195495 | 7/1996 |
| JP | 08-222705 | 8/1996 |
| JP | 08-340120 A | 12/1996 |
| JP | 10-135482 | 5/1998 |
| JP | 10-189977 | 7/1998 |
| JP | 10-189977 A | 7/1998 |
| JP | 10-198292 | 7/1998 |
| JP | 10-229200 | 8/1998 |
| JP | 10-247735 | 9/1998 |
| JP | 10-270363 | 10/1998 |
| JP | 11-311790 | 11/1999 |
| JP | 2000-68204 | 3/2000 |
| JP | 2000-349298 | 12/2000 |

OTHER PUBLICATIONS

C.T. Liu et al., "High Reliability and High Performance .35μm Gate-Inverted TFT's for 16Mbit SRAM Applications Using Self-Aligned LDD Structures," IEDM 92: Technical Digest of International Electron Devices Meeting, 1992, pp. 823-826, AT&T Bell Labs.

Office Action dated Jun. 23, 2008, in counterpart Korean Patent Application No. 2007-0095991 with English translation.

Office Action dated Sep. 30, 2008, in counterpart European Patent Application No. 00105608.4; EP4140).

Furue et al., "P-78: Characteristics and Driving Scheme of Polymer-Stabilized Monostable FLCD Exhibiting Fast Response Time and High Contrast Ratio with Gray-Scale Capability", SID 98 Digest, © 1998, pp. 782-785.

Yoshida et al., "33.2: A Full-Color Thresholdless Antiferroelectric LCD Exhibiting Wide Viewing Angle with Fast Response Time", SID 97 Digest, © 1997, pp. 841-844.

Hatano et al., "A novel Self-Aligned Gate-Overlapped LDD Poly-Si TFT with High Reliability and Performance", IEDM Technical Digest 97, 1997, pp. 523-526.

K. Choi et al., "A Novel Gate-Overlapped LDD Poly-Si Thin-Film Transistor", Dec. 1996, pp. 566-568, IEEE Electron Device Letters, vol. 17, No. 12.

K. Choi et al., Gate-Overlapped Lightly Doped Drain Poly-Si Thin-Film Transistors for Large Area-AMLCD, Jun. 1998, pp. 1272-1279, IEEE Transactions on Electron Devices, vol. 45, No. 6.

M. Hatano et al., "A Novel Self-Aligned Gate-Overlapped LDD Poly-Si TFT with High Reliability and Performance", 1997, pp. 523-526, Central Research Laboratory, Hitachi Ltd.

T. Zhao et al., "A Novel Floating Gate Spacer Polysilicon TFT", 1993, pp. 393-396, Center for Integrated Systems, Stanford University.

(56) References Cited

OTHER PUBLICATIONS

C.T. Liu et al., High Reliability and High Performance .35μm Gate-Inverted TFT's for 16Mbit SRAM Applications Using Self-Ailgned LDD Structures, 1992, pp. 823-826, AT&T Bell Labs.

European Search Report, Date of Search: Dec. 17, 2000, 4 Pages, Place of Search: Vienna.

Inui.S et al. "Thresholdless Antiferroelectricity in Liquid Crystals and Its Application to Displays,", J.Mater.Chem. (Journal of Materials Chemistry), 1996, vol. 6, No. 4, pp. 671-673.

Office Action (Application No. 2007-0095991 dated Nov. 19, 2007) with English translation.

Office Action (Application No. 2007-0095995 dated Nov. 30, 2007) with English translation.

Notice of Patent Grant dated Dec. 28, 2007 for Korean Patent Application No. 10-2000-0015092.

European Office Action (Application No. 00105608.4) Dated Sep. 23, 2014.

\* cited by examiner

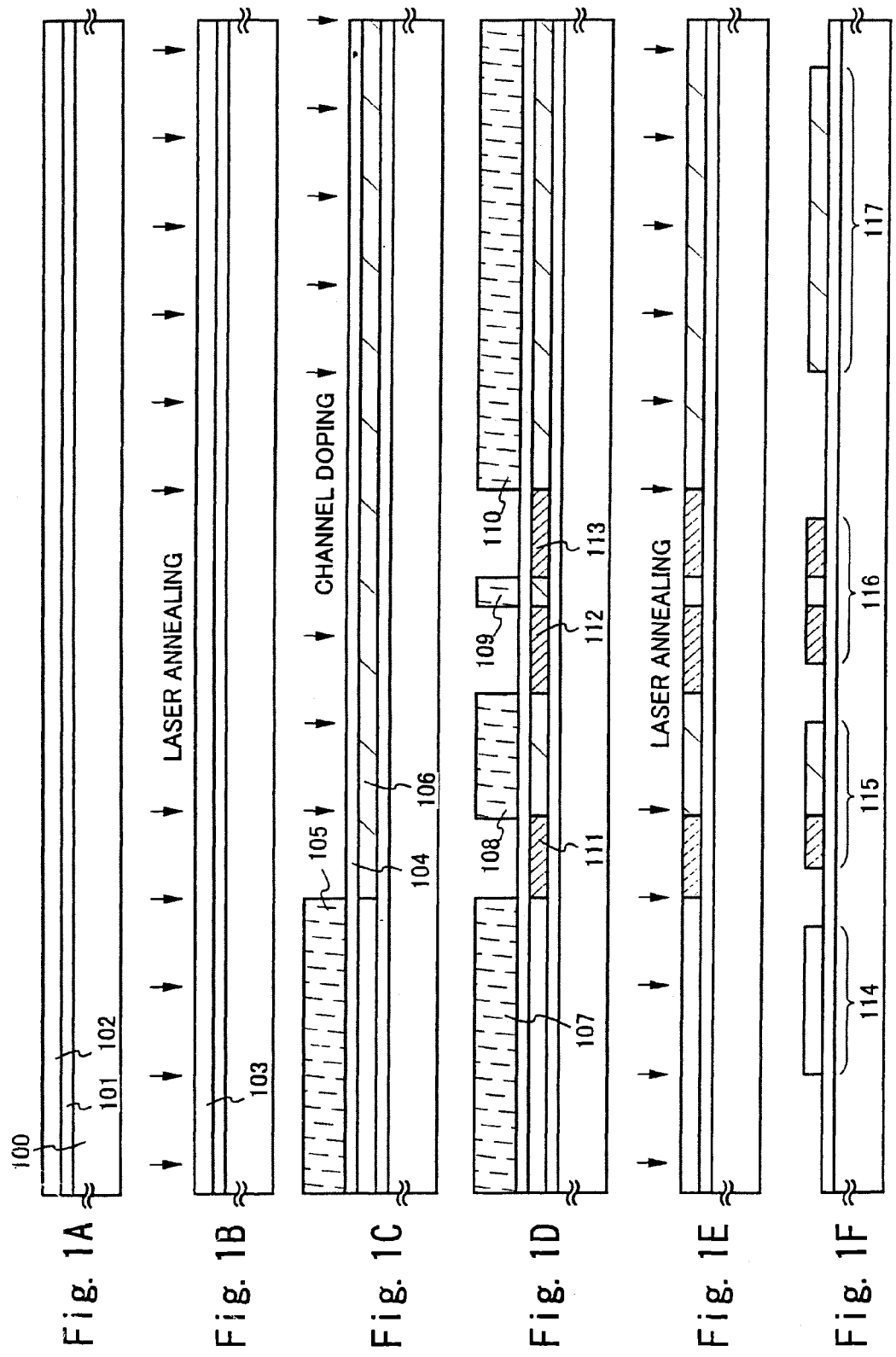

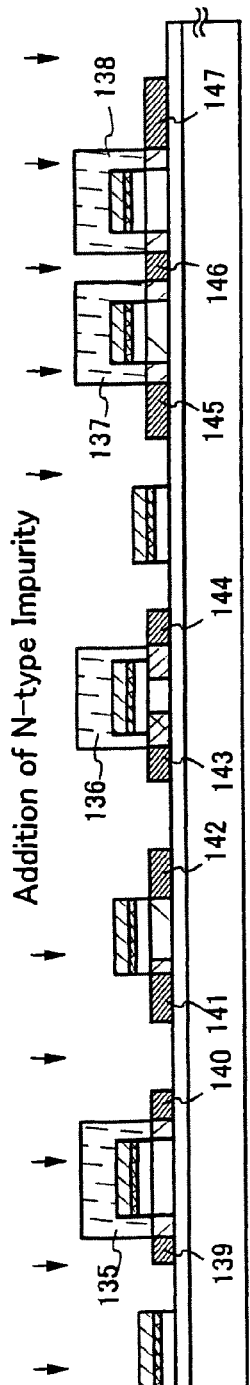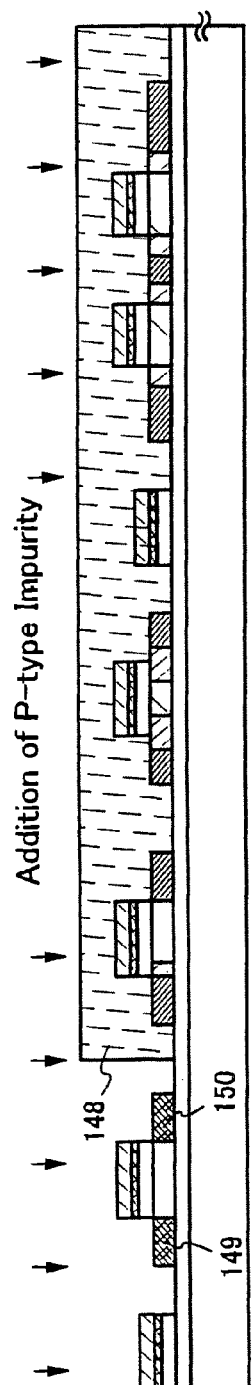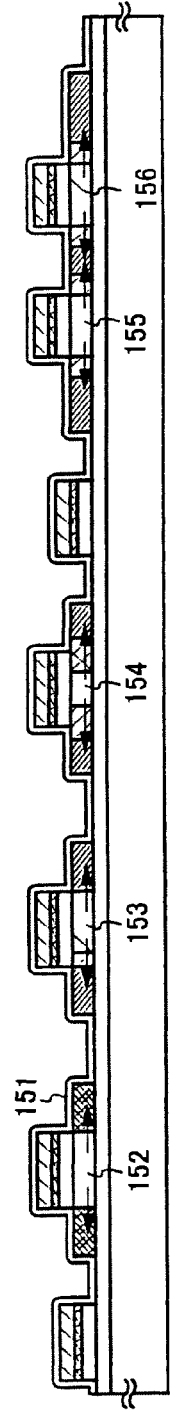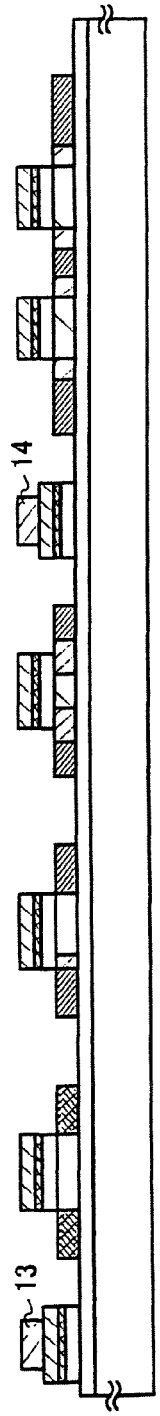

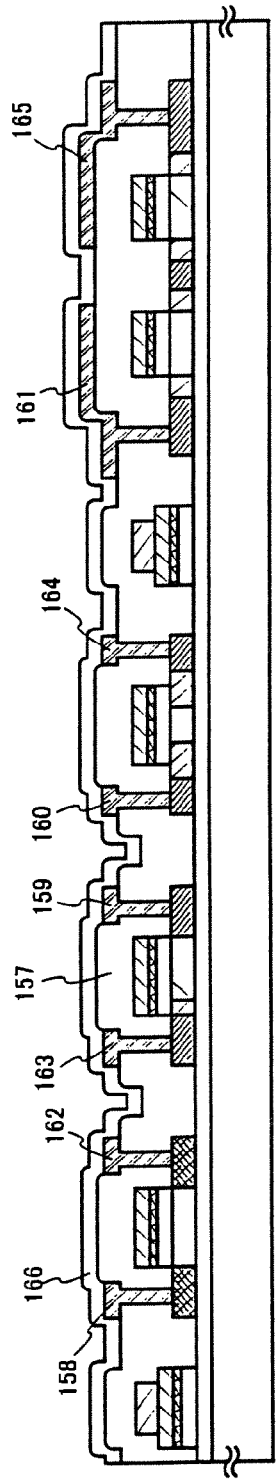
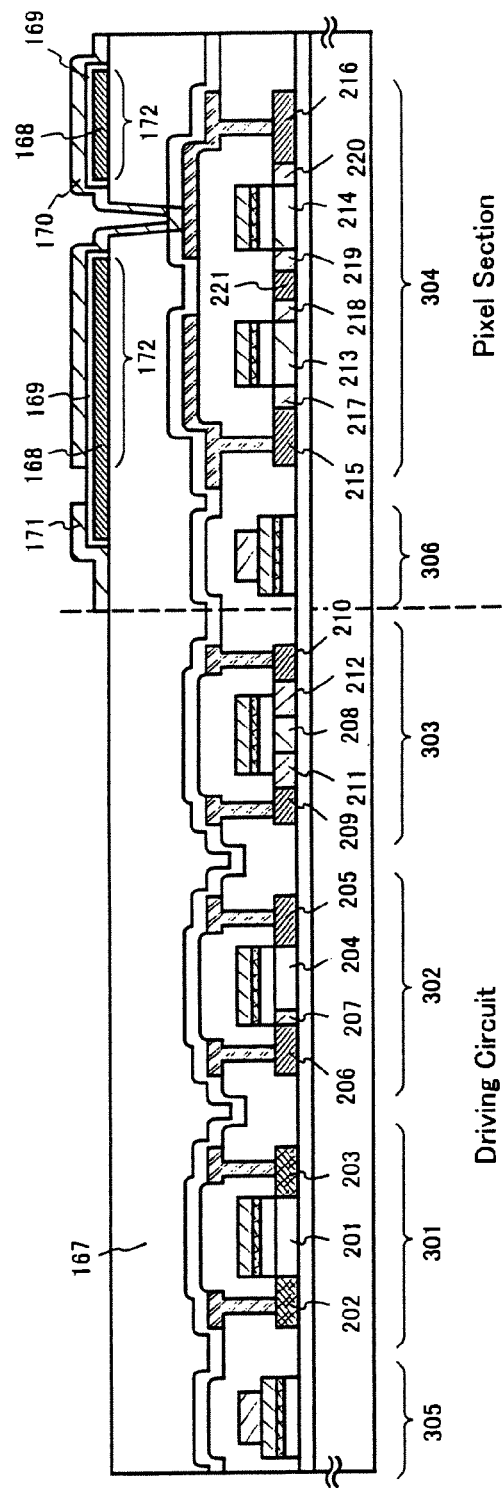
Fig. 4A
Fig. 4B

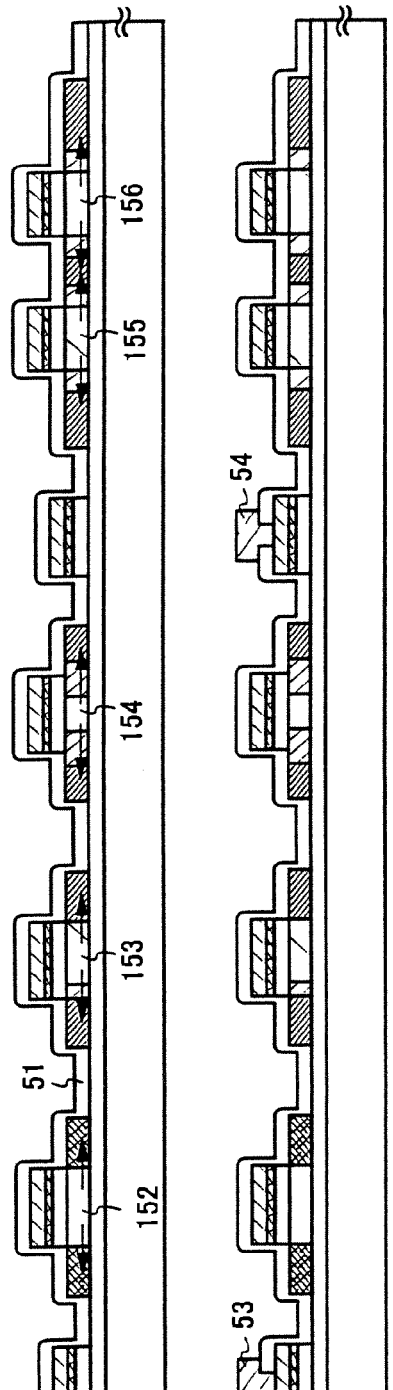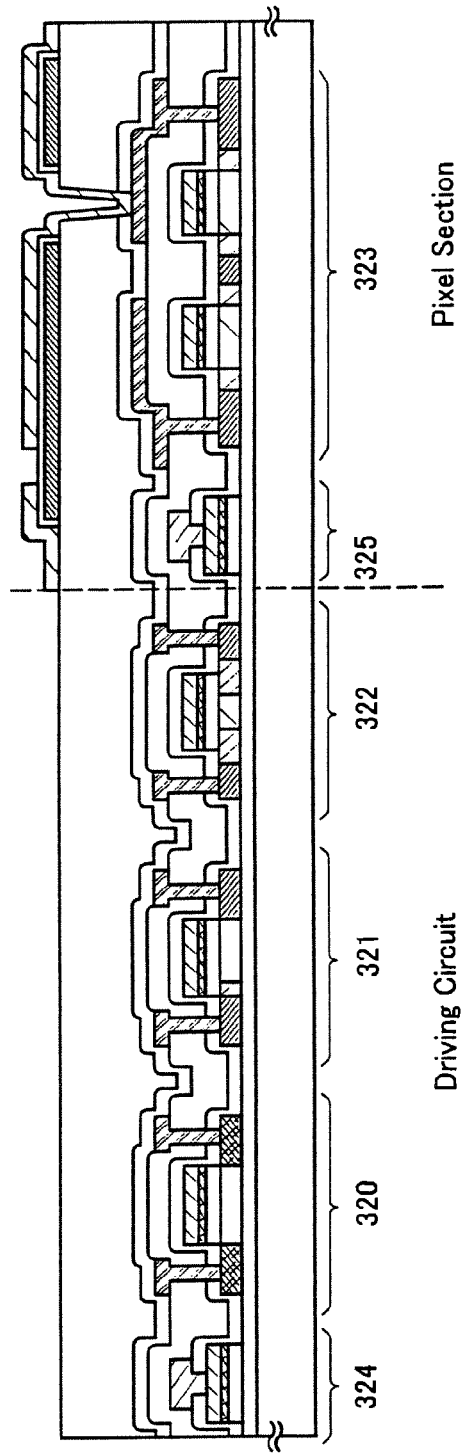
Fig. 12A
Fig. 12B
Fig. 12C

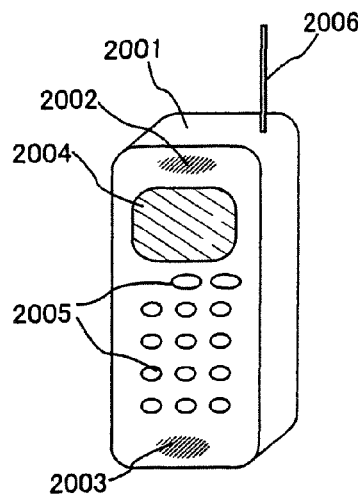
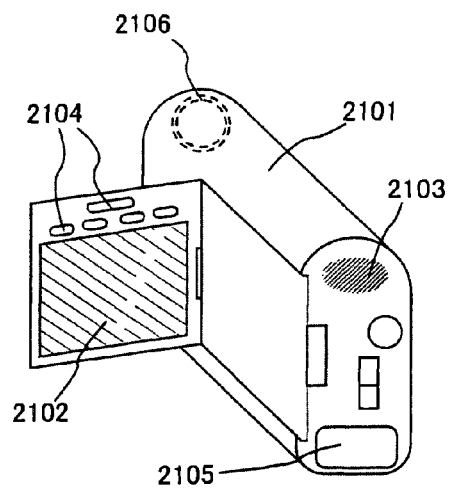
Fig. 19A
Fig. 19B
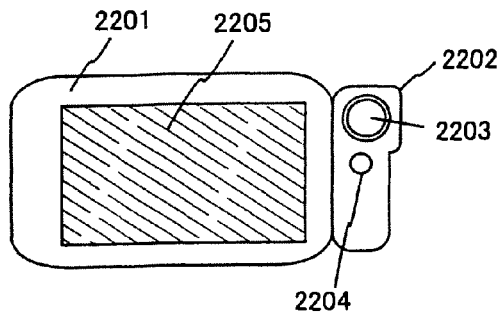
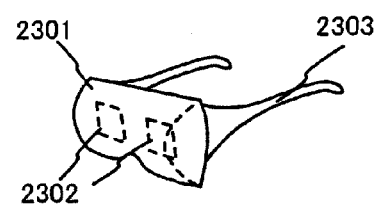
Fig. 19C
Fig. 19D
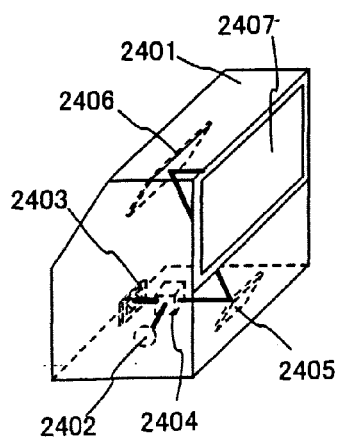
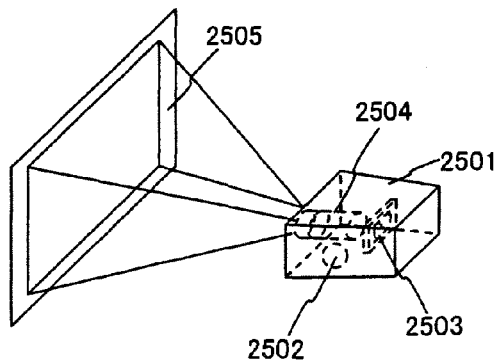
Fig. 19E
Fig. 19F

METHOD FOR MANUFACTURING AN ELECTROOPTICAL DEVICE

BACKGROUND OF THE INVENTION

1. Field of the Invention

This invention relates to a semiconductor device having a circuit comprising thin film transistors (hereinafter referred to as "TFTs") on a substrate having an insulating surface, and to a manufacturing method thereof. More specifically, the present invention relates to electro-optical devices (called also "electronic equipments") typified by a liquid crystal display device including a pixel section (pixel matrix circuit) and driving circuits disposed around the pixel section and formed on the same substrate and an EL (electro-luminescence) display device, and electrical devices (called also "electronic appliances") having the electro-optical device mounted thereto.

Note that, throughout this specification, the semiconductor device indicates general devices that can function by using semiconductor characteristics, and that electro-optical device, semiconductor circuit, and electronic equipment are all categorized as semiconductor devices.

2. Description of the Related Art

Development of a semiconductor device having a large area integrated circuit, that comprises TFTs formed on a substrate having an insulation surface, has been made progressively. An active matrix type liquid crystal display device, an EL display device and a close adhesion type image sensor are typical of such semiconductor devices. Particularly because TFTs using a polycrystalline silicon film (typically, a poly-Si film) as an active layer (the TFT will be hereinafter referred to as "poly-silicon TFT") have high electric field mobility, they can form a variety of functional circuits.

In the active matrix type liquid crystal display device, for example, an integrated circuit that includes a pixel section for displaying images for each functional block, a shift register circuit, a level shifter circuit, a buffer circuit each being based on a CMOS circuit and a sampling circuit, and so forth, is formed on one substrate. In the case of the close adhesion type image sensor, an integrated circuit such as a sample-and-hold circuit, a shift register circuit, a multiplexer circuit, and so forth, are formed by using the TFTs.

These driving circuits (which are also called "peripheral driving circuits") do not always have the same operating condition. Therefore, the characteristics required for the TFTs are naturally different to certain extents. The pixel section comprises a pixel TFT functioning as a switching device and an auxiliary storage capacitor, and a voltage is applied to a liquid crystal to drive it. Here, it is necessary to drive the liquid crystal by alternating current, and a system called "frame inversion driving" is widely applied. Therefore, one of the required characteristics of the TFT is that an OFF current value (a drain current value flowing through the TFT when it is in the OFF operation) must be sufficiently lowered. In a buffer circuit on the other hand, because a high driving voltage is applied, the TFT must have a high withstand voltage such that it does not undergo breakdown even when a high voltage is applied. In order to improve the current driving capacity, it is necessary to sufficiently secure the ON current value (the drain current value flowing through the TFT when it is in the ON operation).

However, the poly-silicon TFT involves the problem that its OFF current is likely to become high. Degradation such as the drop of the ON current value is observed in the poly-silicon TFT in the same way as in MOS transistors used for ICs, or the like. It is believed that the main cause is hot carrier injection, and the hot carriers generated by a high electric field in the proximity of the drain presumably invite this degradation.

An LDD (lightly doped drain) structure is known as a structure of the TFT for lowering the OFF current value. This structure forms an impurity region having a low concentration between a channel forming region and a source or drain region to which an impurity is doped in a high concentration. The low concentration impurity region is called the "LDD region".

A so-called "GOLD (gate-drain overlapped LDD) structure" is also known as a structure for preventing deterioration of the ON current value by hot carrier injection. Since the LDD region is so arranged as to overlap with a gate wiring through a gate insulation film in this structure, this structure is effective for preventing hot carrier injection in the proximity of the drain and for improving reliability. For example, Mutsuko Hatano, Hajime Akimoto and Takeshi Sakai, "IEDM97 Technical Digest", pp. 523-526, 1997, discloses a GOLD structure using side walls formed from silicon. It has been confirmed that this structure provides by far higher reliability than the TFTs having other structures.

In an active matrix type liquid crystal display device, a TFT is disposed for each of dozens to millions of pixels and a pixel electrode is disposed for each TFT. An opposing electrode is provided on an opposing substrate side sandwiching a liquid crystal, and forms a kind of capacitors using the liquid crystal as a dielectric. The voltage to be applied to each pixel is controlled by the switching function of the TFT. As the charge to this capacitor is controlled, the liquid crystal is driven, and an image is displayed by controlling the quantity of transmitting rays of light.

However, the accumulated capacity of this capacitor decreases gradually due to a leakage current resulting from the OFF current, or the like. Consequently, the quantity of transmitting rays of light changes, thereby lowering the contrast of image display. Therefore, it has been customary to dispose a capacitance wiring, and to arrange another capacitor (called a "storage capacitor") in parallel with the capacitor using the liquid crystal as the dielectric in order to supplement the capacitance lost by the capacitor using the liquid crystal as the dielectric.

Nonetheless, the required characteristics of the pixel TFT of the pixel section are not always the same as the required characteristics of the TFT (hereinafter called the "driving TFT") of a logic circuit (called also the "driving circuit") such as the shift register circuit and the buffer circuit. For example, a large reverse bias voltage (a negative voltage in n-channel TFT) is applied to the gate wiring in the pixel TFT, but the TFT of the driving circuit is not fundamentally driven by the application of the reverse bias voltage. The operation speed of the former may be lower than 1/100 of the latter.

The GOLD structure has a high effect for preventing the degradation of the ON current value, it is true, but is not free from the problem that the OFF current value becomes greater than the ordinary LDD structures. Therefore, the GOLD structure cannot be said as an entirely preferable structure for the pixel TFT, in particular. On the contrary, the ordinary LDD structures have a high effect for restricting the OFF current value, but is not resistant to hot carrier injection, as is well known in the art.

For these reasons, it is not always preferred to constitute all the TFTs by the same structure in the semiconductor devices having a plurality of integrated circuits such as the active matrix type liquid crystal display device.

When a sufficient capacitance is secured by forming a storage capacitor using the capacitance wiring in the pixel section as represented by the prior art example described above, an aperture ratio (a ratio of an area capable of image display to an area of one pixel) must be sacrificed. Particularly in the case of a small high precision panel used for a projector type display device, the area per pixel is so small that the drop of the aperture ratio by the capacitance wiring becomes a serious problem.

SUMMARY OF THE INVENTION

In order to solve the problems described above, the present invention aims at improving operation performance and reliability of a semiconductor device by optimizing the structures of the TFT used for each circuit of the semiconductor device in accordance with the function of each circuit.

It is another object of the present invention to provide a structure for lowering the area of a holding capacitance provided to each pixel and for improving an aperture ratio in a semiconductor device having a pixel section.

In order to solve the problems above, the structure of the present invention is characterized by an electrooptical device comprising a pixel section and a driver circuit over a substrate is characterized in that:

a portion or all of an LDD region of n-channel TFT in the driver circuit overlaps with a gate electrode of the n-channel TFT by interposing a gate insulating film;

an LDD region of a pixel TFT in the pixel section is not overlapped with a gate electrode of the pixel TFT through a gate insulating film; and a wiring of a laminate comprising a first electrode formed by a same layer and comprises a same material of the gate electrode of the pixel TFT and a second wiring having a lower resistivity than the first electrode is formed.

In addition to the above structure, a storage capacitor of the pixel section may be formed by a shielding film disposed over an organic resin film, an oxide of the shielding film and a pixel electrode. Because a storage capacitor can be formed in a very small area, an aperture ratio of the pixel can be increased.

Further, another structure of the present invention is characterized in that:

the driver circuit comprises a first n-channel TFT in which all of an LDD region overlaps with a gate electrode by interposing a gate insulating film; and a second n-channel TFT in which a portion of an LDD region overlaps with a gate electrode by interposing a gate insulating film;

an LDD region of the pixel TFT that forms the pixel section does not overlap with a gate electrode of the pixel TFT through a gate insulating film; and a wiring of a laminate comprising a first electrode formed by a same layer and comprises a same material of the gate electrode of the pixel TFT and a second wiring having a lower resistivity than the first electrode is formed.

Needless to say, a storage capacitor of the pixel section may be formed by a shielding film disposed over an organic resin film, an oxide of the shielding film and a pixel electrode.

In the above structure, an n-type impurity element in an LDD region of n-channel TFT of the driver circuit may be preferably included at a concentration of 2 times to 10 times higher than that of an LDD region of the pixel TFT. In addition, an LDD region may be formed on one side of a channel forming region (preferably a drain region side) in the first n-channel TFT, and LDD regions may be formed on both sides of the channel forming region (both sides interposing a channel forming region) in the second n-channel TFT.

Further in the above structure, it is preferable to set the resistivity of the second wiring at $1/10$ to $1/100$ of the resistivity of the first wiring. In concrete, the resistivity of the first wiring may be set at 10 to 500 $\mu\Omega cm$, and the resistivity of the second wiring may be set at 0.1 to 10 $\mu\Omega cm$.

In order to satisfy these conditions, a wiring comprising tantalum, titanium, molybdenum, tungsten, chromium, niobium or silicon may be used as the first wiring, and a wiring comprising aluminum, copper or silver may be used as the second wiring.

Note that through the specification a wiring comprising tantalum, titanium, molybdenum, tungsten, chromium, niobium or silicon denotes a wiring selected from: tantalum wiring, titanium wiring, molybdenum wiring, tungsten wiring, chromium wiring, niobium wiring, silicon wiring, tantalum nitride wiring, titanium nitride wiring, molybdenum nitride wiring, tungsten nitride wiring, niobium nitride wiring and a wiring comprising alloy of 2 or more of the elements selected from tantalum, titanium, molybdenum, tungsten, chromium, niobium and silicon. In addition, a wiring in which these wirings are laminated, is also included.

Also through the specification, a wiring comprising aluminum, copper or silver denotes a wiring selected from: aluminum wiring, copper wiring, silver wiring, and a wiring comprising an alloy including 2 or more of the elements selected from aluminum, copper and silver. In addition, a wiring in which these wirings are laminated, is also included.

As in the structure above, the present invention is largely characterized in that a second wiring having lower resistivity than a first wiring is laminated on the first wiring comprising the same material and formed from the same layer as a gate electrode of the pixel TFT. It is possible to use such wiring for various ways, but it is preferable to use for wiring that requires to flow large electric current.

Specifically it is effective to use for a wiring to send electric signal to the driver circuit (hereinafter referred to as input-output signal wiring) and a gate wiring. As an input-output signal wiring, there are wirings to transmit clock signal, start pulse signal or a video signal.

In other words, an input-output signal wiring and a gate wiring (including gate electrode) are formed from a first wiring comprising the same material and formed from the same layer (namely formed at the same time) as a gate electrode of the pixel TFT (same is true of a gate electrode of the n-channel TFT). After finishing activation of the source regions and the drain regions, a second wiring that has a lower resistivity than the first wiring is laminated on the first wiring to form a wiring of low resistivity.

At this time it is preferred that the portions where the second wiring is laminated do not require a minute processing and have least resistivity as possible. Namely, portions that require minute processing such as a gate electrode and an internal wiring of the driver circuit may be formed from the first wiring, and portions where minute processing is not required may be formed by a wiring of a laminate of the first wiring and the second wiring.

BRIEF DESCRIPTION OF THE DRAWINGS

In the accompanying drawings:
FIGS. 1A to 1F are figures showing manufacturing processes of the pixel section and the driver circuit.
FIGS. 3A to 3D are figures showing manufacturing processes of the pixel section and the driver circuit.
FIGS. 4A and 4B are figures showing manufacturing processes of the pixel section and the driver circuit.

FIGS. 12A to 12C are figures showing manufacturing process of a pixel section and a driver circuit.

FIGS. 19A to 19F are examples of electronic devices.

Figure 2A:
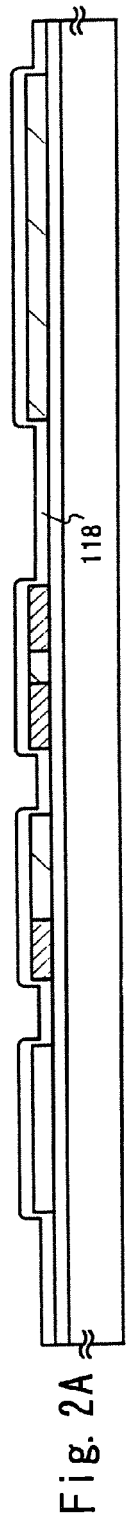
FIGS. 2A to 2E are figures showing manufacturing processes of the pixel section and the driver circuit.

Chart 1 shows a comparative data of sheet resistance in metal materials.

DESCRIPTION OF THE PREFERRED EMBODIMENTS

Embodiment Mode

The embodiment mode of the present invention is described in details by embodiments shown below.

Embodiment 1

An embodiment according to the present invention is described by using FIGS. 1A to 4B. Here a method for fabricating of a pixel section and a driver circuit provided in its peripheral, at the same time, is described. Provided, for the simplicity of explanation, a CMOS circuit which is a basic circuit for a shift register and buffer etc., and an n-channel TFT forming a sampling circuit are shown for the driver circuit.

In FIG. 1A, it is preferable to use a glass substrate or a quartz substrate for substrate 100. A silicon substrate, a metal substrate or a stainless substrate having an insulating film formed on the surface thereof can be used, too. If heat resistivity permits, plastic substrate may also be used.

A base film 101 that comprises a silicon-containing insulating film (the term "insulating film" generically represents a silicon oxide film, a silicon nitride film and a silicon nitride oxide film in this specification) is formed by plasma CVD or sputtering to a thickness of 100 to 400 nm on the surface of the substrate 100 on which the TFTs are to be fabricated.

The term "silicon nitride oxide film" used in this specification represents an insulating film expressed by the general formula $SiO_xN_y$, and containing silicon, oxygen and nitrogen in a predetermined proportion. In embodiment 1, a laminate film may be used as the base film 101, that comprises a silicon nitride oxide film with a thickness of 100 nm containing nitrogen at 20 to 50 atomic % (typically 20 to 30 atomic %), and a silicon nitride oxide film with a thickness of 200 nm containing nitrogen at 1 to 20 atomic % (typically 5 to 10 atomic %). The thickness is not necessarily limited to these values. The ratio of nitrogen and oxygen contained in a silicon nitride oxide film (ratio by atomic %) may be set 3:1 to 1:3 (typically 1:1). A silicon nitride oxide film may be fabricated from raw material gas of $SiH_4$, $N_2O$ and $NH_3$.

The base film 101 is formed in order to prevent impurity contamination from the substrate, and does not necessarily be formed for the case of a quartz substrate being used.

A semiconductor film containing amorphous structure (amorphous silicon film in the present embodiment (not shown)) is formed on the base film 101 at a thickness of 30 to 120 nm (preferably 50 to 70 nm) by a known film formation method. As a semiconductor film containing amorphous structure, there are amorphous semiconductor film and microcrystalline semiconductor film and further, a compound semiconductor film containing amorphous structure such as amorphous silicon germanium film etc. may also be included.

A semiconductor film containing crystalline structure (crystalline silicon film in the embodiment 1) 102 is formed according to a technique disclosed in the Japanese Patent Application Laid-Open No. Hei 7-130652 (corresponding to U.S. Pat. No. 5,643,826). The technique described in the gazette is a crystallization means that uses a catalytic element for promoting crystallization (one or plural of element selected from nickel, cobalt, germanium, tin, lead, palladium, iron and copper; typically nickel) in crystallizing the amorphous silicon film.

More concretely, heat-treatment is conducted under the condition where the catalytic element(s) is held on the surface of the amorphous silicon film to convert the amorphous silicon film to the crystalline silicon film. Although Embodiment 1 uses a technique described in the Embodiment 1 of the gazette, a technique described in Embodiment 2 may also be used. Though single crystal silicon film and polycrystalline silicon film are both included in crystalline silicon film, the crystalline silicon film formed in the present embodiment is a silicon film having crystal grain boundaries. (FIG. 1A)

Though it depends on hydrogen content in the amorphous silicon film, it is preferable to carry out dehydrogenation process by heating at 400 to 550° C. for some hours to reduce the contained hydrogen amount at 5 atomic % or lower and conduct crystallization process. The amorphous silicon film may be fabricated by other fabricating methods such as sputtering or vapor deposition, but it is preferable to sufficiently reduce impurity elements such as oxygen or nitrogen contained in the film.

Because base film and amorphous silicon film can be fabricated by the same deposition method, they may be successively formed. Scattering of characteristics of the fabricated TFTs may be reduced by making it possible to prevent contamination of the surface by not exposing to the atmosphere after formation of the base film.

Next, a light generated from a laser light source (laser light) is irradiated onto the crystalline silicon film 102 (hereinafter referred to as laser anneal) and a crystalline silicon film 103 in which crystallinity is improved is formed. Though a pulse oscillation type or a continuous oscillation type excimer laser light is preferable for the laser light, a continuous oscillation type argon laser light may also be used as the laser light. The beam shape of the laser light may be linear, or it may be a rectangular shape. (FIG. 1B)

A light generated from a lamp (lamp radiation) may be irradiated (hereinafter referred to as lamp annealing) may be used in place of laser light. As a lamp radiation, lamp radiation generated from halogen lamp or infrared lamp may be used.

The process of conducting heat treatment (annealing) by laser light or lamp radiation is called a light annealing process. Because light annealing process can perform a high temperature heat treatment in a short time, effective heat treatment process may be carried out at high throughput even in the case of using a substrate with low heat resistance such as glass substrate etc. Needless to say, since the object is annealing, it can be substituted by a furnace annealing (it may also be called heat annealing) using electric furnace.

In the embodiment 1, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 250 to 500 mJ/cm$^2$ (typically 350 to 400 mJ/cm$^2$).

Laser annealing process carried out at the above stated conditions has an effect of completely crystallizing the amorphous region remained after heat crystallization as well as reducing defects in the crystalline region already crystallized. Accordingly, the present process may be called a process for improving crystallinity of the semiconductor film, or a process for promoting crystallization of the semiconductor film. Such effects can be obtained by optimizing lamp annealing condition. This condition is referred to as the first light annealing in the present specification.

Next, a protecting film 104 is formed on crystalline silicon film 103 for the later impurity doping process. Silicon nitride oxide film or silicon oxide film at a thickness of 100 to 200 nm (preferably 130 to 170 nm) is used for the protecting film 104. This protecting film 104 has a meaning of not to expose the crystalline silicon film directly to plasma at impurity doping, and to make minute concentration control possible.

Then, a resist mask 105 is formed thereon, and impurity element imparting p-type (hereinafter referred to as p-type impurity element) is doped through protecting film 104. As a p-type impurity element, typically an element belonging to group 13 or more specifically boron or gallium may be used. This process (referred to as channel doping process) is a process for controlling threshold voltage of a TFT. Here, boron is doped by ion doping in which diborane (B$_2$H$_6$) is excited by plasma without mass separation. Needless to say, it is acceptable to use ion implantation in which mass separation is performed.

By this process, impurity region 106 including p-type impurity (boron in the present embodiment) at a concentration of 1×10$^{15}$ to 1×10$^{18}$ atoms/cm$^3$ (typically 5×10$^{16}$ to 5×10$^{17}$ atoms/cm$^3$) is formed. Note that through the specification, an impurity region containing p-type impurity region in the above stated concentration range is defined as a p-type impurity region (b) (provided, regions where impurity elements imparting n-type are intentionally doped are excluded). (FIG. 1C)

Next, resist mask 105 is removed and resist masks 107 to 110 are newly formed. Then impurity regions imparting n-type 111 to 113 are formed by doping impurity elements imparting n-type (hereinafter referred to as n-type impurity element). As an n-type impurity element, typically an element belonging to group 15 or more specifically phosphorus or arsenic may be used. (FIG. 1D)

These low concentration impurity regions 111 to 113 are impurity regions functions as LDD regions of the n-channel TFT of the later formed CMOS circuit and sampling circuit. In thus formed impurity regions, n-type impurity element is contained at a concentration of 2×10$^{16}$ to 5×10$^{19}$ atoms/cm$^3$ (typically 5×10$^{17}$ to 5×10$^{18}$ atoms/cm$^3$). In the present specification, an impurity region containing n-type impurity region in the above stated concentration range is defined as an n-type impurity region (b).

Here, phosphorus is doped by ion doping in which phosphine (PH$_3$) is excited by plasma without mass separation. Needless to say, ion implantation in which mass separation is performed may be used as well. In this process, phosphorus is doped into the crystalline silicon film through protecting film 107.

Next, protecting film 104 is removed, and irradiation process of laser light was conducted again. Here again excimer laser light of pulse oscillation type or continuous oscillation type is preferable, but argon laser light of continuous oscillation type may also be used. The beam shape of the laser light may be either of linear or rectangular shape. Provided, because activation of the doped impurity element is the object, it is preferable to irradiate with an energy at a level of not melting the crystalline silicon film. It is also possible to conduct laser annealing process with the protecting film 104 left thereon. (FIG. 1E)

In embodiment 1, laser annealing process was carried out by forming pulse oscillation type excimer laser light into a linear shape. The laser annealing conditions are: XeCl gas is used as excitation gas, treatment temperature is set at room temperature, pulse oscillation frequency is set at 30 Hz, and laser energy density at 100 to 300 mJ/cm$^2$ (typically 150 to 250 mJ/cm$^2$).

The light annealing process carried out on the above stated conditions has an effect of recrystallizing the semiconductor film that was made into amorphous in impurity element doping as well as activating the impurity element imparting n-type or p-type that was doped. It is preferable that the above stated conditions make atomic arrangement coordinated without melting the semiconductor film and at the same time activate the impurity elements. The present process may be referred as a process of activating the impurity element imparting n-type or p-type by light annealing, a process for recrystallizing the semiconductor film or a process of simultaneously carrying out both of them. Such effect can be obtained by optimizing the lamp annealing condition as well. In the present specification, this condition is referred to as the second light annealing.

By this process, the boundary of n-type impurity regions (b) 111 to 113, that is, the junction area with the intrinsic regions (p-type impurity region (b) is also regarded as substantially intrinsic) that exist around n-type impurity region (b) become clear. This means that LDD region and channel formation region may form a very good junction when later finishing TFT.

On activation of the impurity elements by this laser light, activation by heat treatment may also be used at the same time. In case of conducting activation by heat treatment, heat treatment of approximately 450 to 550° C. may be conducted considering the heat resistance of the substrate.

Next, unnecessary portions of the crystalline silicon film are removed to form island semiconductor layers (hereinafter referred to as active layers) 114 to 117. (FIG. 1F)

Next, gate insulating film 118 is formed to cover the active layers 114 to 117. Gate insulating film 118 may be formed into a thickness of 10 to 200 nm, preferably into 50 to 150 nm. In the present embodiment, a silicon nitride oxide film is formed into a thickness of 115 nm by plasma CVD with raw materials of N$_2$O and SiH$_4$. (FIG. 2A)

Figure 2B:
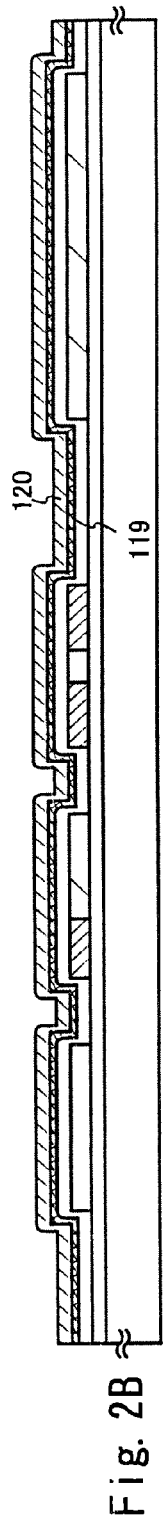

Then, a conductive film, that will form a gate wiring (including gate electrode) and an input-output signal wiring, is formed. Note that the conductive film may be formed by a single layer, and it is preferable to form laminated films of double layers, or triple layers as occasion demands. In the present embodiment, laminated films comprising a first conductive film 119 and a second conductive film 120. (FIG. 2B)

As the first conductive film 119 and the second conductive film 120, a metal film comprising an element selected from tantalum (Ta), titanium (Ti), molybdenum (Mo), tungsten (W), chromium (Cr), niobium (Nb), and silicon (Si), a metal compound film composed of these element as its main component (typically tantalum nitride film, tungsten nitride film, titanium nitride film), an alloy film combining these elements (typically Mo—W alloy, Mo—Ta alloy, tungsten silicide film) or a laminate film of these thin films may be used.

The first conductive film 119 may be formed into 10 to 50 nm (preferably 20 to 30 nm) and the second conductive film 120 may be formed into 200 to 400 nm (preferably 250 to 350 nm). In embodiment 1, tantalum nitride (TaN) film of 50 nm thick was used as the first conductive film 119 and tantalum (Ta) film of 350 nm thick was used as the second conductive film 120.

Other than this, a laminate of tungsten nitride film and tungsten film, single layer of tantalum nitride film and a tungsten silicide film are also appropriate. In addition, when a silicon film at a thickness of approximately 2 to 20 nm is formed under the first conductive film 119, close adhesion of conductive film formed on the silicon film is improved and oxidation of the conductive film can be prevented.

Further, it is effective to nitrificate by exposing the surface into plasma atmosphere using ammonia gas or nitrogen gas, in case of using a metal film for the second conductive film 120 like in embodiment 1. It is possible to prevent the oxidation of the surface of the metal film.

Figure 2C:
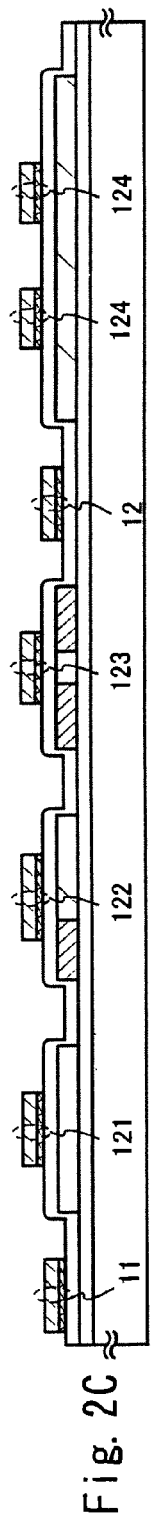

Gate electrodes 121 to 124, a first wiring 11 that will later form an input-output signal wiring and a first wiring 12 that will later form a gate wiring are formed into 400 nm thickness by etching the first conductive film 119 and the second conductive film 120 at a time. Gate electrodes 122 and 123 of n-channel TFT of driver circuit are formed to overlap a portion of n-type impurity region (b) 111 to 113 by interposing a gate insulating film. These overlapped portions will later become Lov regions. Note that the gate electrode 124 seems to be two electrodes in the cross sectional view, but in effect they are formed of one continuing pattern. (FIG. 2C)

Note that through the specification a wiring formed of a same layer as gate electrode and comprised of the same material is generically referred to as a first wiring. Further, an input-output signal wiring in this specification means generically an input signal wiring or an output signal wiring that transmits from an external input-output terminal (hereinafter referred to as terminal) such as an FPC (flexible print circuit), various signals such as a drive signal (start pulse signal, clock signal etc.) and an image signal into driver circuit of an electrooptical device.

In addition, in some cases terms "gate electrode" and "gate wiring" are used distinctively for the ease of explanation. In these cases a section where a gate wiring overlaps with an active layer is referred to as a gate electrode. Accordingly, no problem arises even when a gate electrode is referred to as a gate wiring.

Figure 2D:
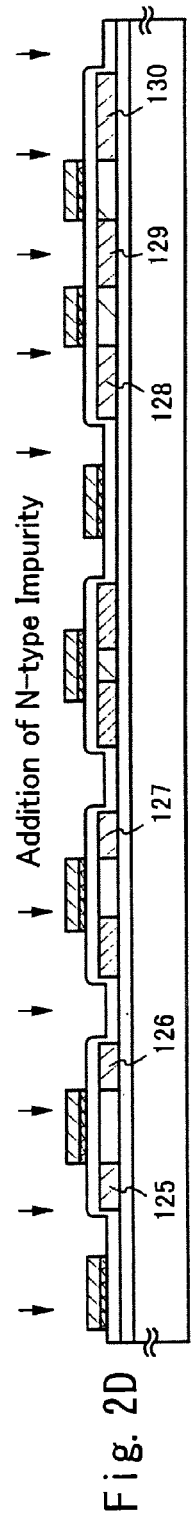

Then, n-type impurity element (phosphorus in embodiment 1) is doped in a self-aligned manner using gate electrodes 121 to 124 and the first wirings 11 and 12 as masks. The concentration of phosphorus doped into thus formed impurity regions 125 to 130 are set at a ½ to 1/10 (specifically ⅓ to ¼) of the n-type impurity region (b) (provided it is higher by 5 to 10 times than boron concentration added in the channel doping process, specifically $1\times10^{16}$ to $5\times10^{18}$ atoms/cm$^3$, typically $3\times10^{17}$ to $3\times10^{18}$ atoms/cm$^3$). In the present Specification, an impurity region containing n-type impurity element at the above stated concentration range is defined as n-type impurity region (c). (FIG. 2D)

Note that phosphorus is doped into all of the n-type impurity regions (b) at a concentration of $1\times10^{16}$ to $5\times10^{18}$ atoms/cm$^3$ except regions hidden by the gate wirings in this process however since it is at a very low concentration, there is no effect to the function as n-type impurity region (b). Further, although boron is already doped into n-type impurity regions (b) 127 to 130 at a concentration of $1\times10^{15}$ to $5\times10^{18}$ atoms/cm$^3$ in the channel doping process, because phosphorus is doped at a concentration of 5 to 10 times that of boron contained in the p-type impurity region (b), there is no effect to the function of n-type impurity region (b) also in this case.

Strictly speaking however, while concentration of phosphorus in portions of n-type impurity region (b) 111 to 113 that overlapped with gate wirings remains at $2\times10^{16}$ to $5\times10^{19}$ atoms/cm$^3$, portions that do not overlap with gate wirings are further added with phosphorus of $1\times10^{16}$ to $5\times10^{18}$ atoms/cm$^3$, and contain phosphorus at a slightly higher concentration.

Figure 2E:
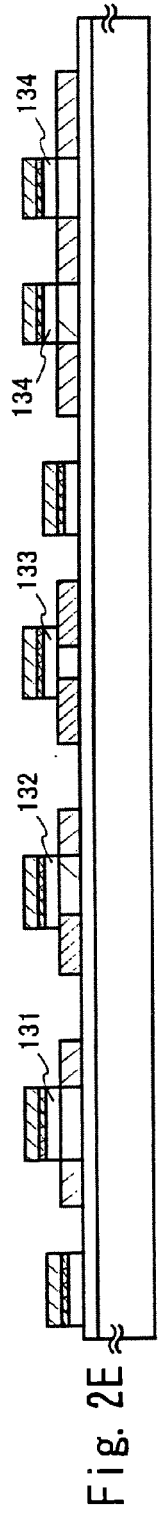

Next, a gate insulating film 118 is etched in a self-aligned manner with gate electrodes 121 to 124 and first wiring 11 and 12 as masks. Dry etching is used for the etching process and CHF$_3$ gas is used as an etching gas. Note that the etching gas need not be limited to this material. Thus, gate insulating films 131 to 134 under the gate wirings are formed. (FIG. 2E)

By exposing the active layers in this manner, acceleration voltage in performing doping process of impurity elements can be kept low. Accordingly throughput is improved since the necessary dose amount is small. Needless to say, the impurity regions may also be formed by through doping without etching the gate insulating film.

Resist masks 135 to 138 are next formed to cover the gate wirings and impurity regions 139 to 147 containing phosphorus at a high concentration were formed by adding n-type impurity element (phosphorus in embodiment 1). Again ion doping was conducted by utilizing phosphine (PH$_3$) and the phosphorus concentration in these regions are set at $1\times10^{20}$ to $1\times10^{21}$ atoms/cm$^3$ (specifically $2\times10^{20}$ to $5\times10^{21}$ atoms/cm$^3$). (FIG. 3A)

Note that in this Specification an impurity region containing n-type impurity element in the above stated concentration range is defined as n-type impurity region (a). Further, although phosphorus or boron, added in the preceding processes, are already contained in the impurity regions 139 to 147, influence of phosphorus or boron added in the preceding processes need not be considered since phosphorus is later added at a sufficiently high concentration. Therefore, it is acceptable to refer the impurity regions 139 to 147 to as n-type impurity region (a) in this Specification.

Resist masks 135 to 139 are then removed, and new resist mask 148 is formed. Then, p-type impurity element (boron in the present embodiment) is doped, and impurity regions 149 and 150 that include boron at a high concentration are formed. Here, boron is doped at a concentration of $3\times10^{20}$ to $3\times10^{21}$ atoms/cm$^3$ (typically $5\times10^{20}$ to $1\times10^{21}$ atoms/cm$^3$) by ion doping using diborane (B$_2$H$_6$). In the present specification, an impurity region that includes p-type impurity region in the above stated concentration range is defined as p-type impurity region (a). (FIG. 3B)

Phosphorus is doped in a portion of impurity regions 149 and 150 (n-type impurity regions (a) 139 and 140 stated above) at a concentration of $1\times10^{20}$ to $1\times10^{21}$ atoms/cm$^3$. However boron is doped at a concentration higher by at least 3 times here. Therefore, already formed n-type impurity regions are totally inverted to p-type, and function as p-type impurity regions. Accordingly, it is acceptable to define impurity regions 149 and 150 as p-type impurity regions (a).

After removing resist mask 148, a protection film 151 is formed. A protection film 151 may be formed from an insulating film comprising silicon, concretely a silicon nitride film, a silicon oxide film, a silicon oxide nitride film or a laminate combining these films. The film thickness may be set at 20 to 200 nm (preferably 30 to 150 nm). In embodiment 1, a silicon nitride film with 50 nm thickness is used. This protection film is effective for preventing increase in resistivity due to oxidation of the first wirings 11 and 12 and gate electrodes 121 to 124, in the heat treatment process (activation process) performed next.

A heat treatment process is performed next in order to activate the impurity elements of n-type or p-type conductivity and which have been doped at their respective concentrations. Furnace annealing, laser annealing, rapid thermal annealing (RTA), or lamp annealing can be performed for this process. The activation process is performed by furnace annealing in embodiment 1. Heat treatment is performed in a nitrogen atmosphere at between 300 and 650° C. for 3 to 12 hours, preferably from 400 to 550° C. for 4 to 6 hours, at 450° C. for 2 hours here. (FIG. 3C)

The catalytic element (nickel in embodiment 1) used in crystallization of an amorphous silicon film in embodiment 1 moved in the direction of the arrows and is captured in a region containing phosphorus at a high concentration (gettering) formed in the process of FIG. 3A. This is a phenomenon originated from gettering effect of a metal element by phosphorus. As a result, the concentration of nickel contained in later formed channel forming regions 152 to 156 is reduced below $1\times10^{17}$ atoms/cm$^3$ (preferably to $1\times10^{16}$ atoms/cm$^3$).

Conversely, the catalytic element precipitated at a high concentration in the regions which functioned as gettering sights of the catalytic element (regions where impurity regions 139 to 147 were formed in the process of FIG. 3A). The catalytic element existed in these regions at a concentration exceeding $5\times10^{18}$ atoms/cm$^3$ (typically $1\times10^{19}$ to $5\times10^{20}$ atoms/cm$^3$).

Further, a hydrogenation process is performed on the active layers by performing heat treatment in an atmosphere containing 3 to 100% hydrogen at 300 to 550° C. for 1 to 6 hours (350° C. for 2 hours in embodiment 1). This is a process to terminate dangling bonds in the semiconductor layers by thermally activated hydrogen. Plasma hydrogenation (using hydrogen activated by plasma) may be performed as another hydrogenation means.

After completing the activation process, the protection film 151 is selectively removed. Here, attention should be paid not to remove the first wirings (including gate electrodes), gate insulating film, active layers, etc., at the same time with removing the protection film 151. Since silicon nitride film is used as the protection film 151 in this embodiment it may be easily removed by wet etching using a mixed etching species of hydrofluoric acid aqueous and ammonium fluoride solution. In addition, as a protection film that is easily removed, it is effective to use a silicon oxide film that is formed by applying solution.

While activation process is performed with the protection film 151 in embodiment 1, the activation process may be performed without a protection film. In such cases, it is preferable to reduce oxygen concentration as possible in the heat treatment atmosphere so as not to form oxide on the surfaces of gate electrodes 121 to 124, the first wiring 11 and 12. In concrete, the oxygen concentration is kept 1 ppm or lower, preferably 0.1 ppm or lower. The process of removing the protection film 151 can be omitted by doing so.

After removing the protection film 151, a film comprising aluminum or a material which has aluminum as its main component (hereinafter referred to as aluminum type thin film) is formed to form the second wirings 13 and 14 having lower resistivity than the first wirings. In embodiment 1, aluminum film containing 2 wt % of silicon is used as the aluminum type thin film. The second wiring 13 is formed on the first wiring 11 which later becomes an input-output signal wiring, and the second wiring 14 is formed on the first wiring 12. Note that it is preferable to fabricate the second wirings 13 and 14 inside of the first wirings 11 and 12 by 0 to 2 m. (FIG. 3D)

The first interlayer insulating film 157 is next formed into 500 nm to 1.5 m. In embodiment 1 the first inter layer insulating film 157 if formed by silicon oxide film into 1 m thickness by plasma CVD. Needless to say, a laminate structure combining insulating films comprising silicon such as a laminate of a silicon nitride film and a silicon oxide film may also be adopted. Further, it is possible to use organic resin films such as polyimide, acrylic, polyamide, polyimide amide, BCB (benzocyclobutene) may also be adopted for the first interlayer insulating film.

Contact holes are then formed in order to reach the source regions or the drain regions of the respective TFTs, and source wirings 158 to 161, and drain wirings 162 to 165 are formed. Note that, although not shown in the figures, the drain wirings 162 and 163 are connected as the same drain wiring in order to form a CMOS circuit. Note that, although not shown in the figures, in embodiment 1 the electrodes are made with a three-layer structure laminate film of a 100 nm Ti film, a 300 nm aluminum film containing Ti, and a 150 nm Ti film formed successively by sputtering. Also note that a copper wiring and a titanium nitride wiring may be laminated as a source wiring or a drain wiring. (FIG. 4A)

A silicon nitride film, a silicon oxide film, or a silicon oxide nitride film is formed to a thickness of between 50 and 500 nm (typically 200 to 300 nm) next as a passivation film 166. A plasma treatment using a gas that contains hydrogen such as $H_2$ and $NH_3$ may be performed preceding formation of the film and heat treatment may be performed after the film formation. The preceding process provides excited hydrogen into the first interlayer insulating film. By performing a heat treatment to this state, the active layers are effectively hydrogenated because hydrogen added into the first interlayer insulating film is diffused in the layer underneath, as well as improving the film quality of passivation film 166.

Further, after forming the passivation film 166, an additional hydrogenation process may be performed. For example, it is good to perform heat treatment for 1 to 12 hours at between 300 and 450° C. in an atmosphere including from 3 to 100% hydrogen. Or, a similar result can be obtained by using plasma hydrogenation. Note that openings may be formed here in the passivation film 166 at positions where contact holes will be formed later in order to connect the pixel electrode and the drain wirings.

A second interlayer insulating film 167 made from an organic resin is formed next with an approximately 1 μm thickness. Polyimide, acrylic, polyamide, polyimide amide, BCB (benzocyclobutane), etc., can be used as the organic resin. The following points can be given as the benefits of using an organic resin film: easy film deposition; the parasitic capacitance can be reduced because the specific dielectric constant is low; and superior levelness. Note that in addition to the above, other organic resin films, organic SiO compounds, etc. can be used. A thermal polymerization type polyimide is used here, and after application to the substrate, it is baked at 300° C. to form the film.

Further, it is possible to provide a resin film colored by pigment etc. as a part of layer of the second interlayer insulating film 167 and use is as the color filter.

A shielding film 168 is formed next on the second interlayer insulating film 167 in the region that becomes the pixel section. A term "shielding film" is used through the specification to have a meaning of shielding light or electromagnetic wave. The shielding film 168 is a film of an element chosen from among aluminum (Al), titanium (Ti), and tantalum (Ta), chromium (Cr), tungsten (W) or a film with one of these as its principal constituent, formed to a thickness of between 100 and 300 nm. In embodiment 1 an aluminum film containing titanium at 1 wt % is formed into 125 nm thick.

Note that if an insulating film such as a silicon oxide film is formed to a thickness of 5 to 50 nm on the second interlayer insulating film 167, then the adhesiveness of the shielding film formed on top can be increased. Further, if plasma processing using $CF_4$ gas is performed on the surface of the second interlayer insulating film 167, which is formed by an organic resin, then the adhesiveness to the shielding film formed on this film can be increased by surface refinement.

Further, it is possible to form other connecting wirings, not only the shielding film, by using the film containing titanium. For example, a connecting wiring for connecting between circuits can be formed inside the driver circuit. However, in this case, before depositing the material that forms the shielding film or the connecting wiring, it is necessary to form contact holes, in advance, in the second interlayer insulating film 167.

Next, an oxide film 168 with a thickness from 20 to 100 nm (preferably between 30 and 50 nm) is formed on the surface of the shielding film 168 by anodic oxidation or plasma oxidation. An aluminum oxide film (alumina film) is formed here as the anodic oxide film 169 because an aluminum film, or a film with aluminum as its principal constituent, is used as the shielding film 168 in embodiment 1.

When performing anodic oxidation processing, a tartaric acid ethylene glycol solution with a sufficiently low alkaline ion concentration is first manufactured. This is a solution in which a 15% tartaric acid ammonium aqueous solution and an ethylene glycol solution are mixed in a 2:8 ratio. Aqueous ammonia is added thereto so that the pH is regulated to be 7±0.5. A platinum electrode is placed in the solution as a cathode, the substrate on which the shielding film 168 is formed is immersed in the solution, and a constant dc current (from several mA to several tens mA) is applied with the shielding film 168 as an anode.

The voltage between the cathode and the anode in the solution changes along with time in accordance with the oxide film growth. The voltage is increased at an increase rate of 100V/min under a constant current, and the anodic oxidation process is stopped when the voltage becomes 45 V. Thus the anodic oxide film 169 can be formed with a thickness of approximately 50 nm on the surface of the shielding film 168. As a result, the thickness of the shielding film 168 will be 90 nm. Note that the numerical values shown here for the anodic oxidation process are only examples, and that they may naturally be changed to the most suitable values depending upon the size of the element being manufactured, etc.

Further, the structure used here has the insulating film being formed only on the surface of the shielding film, but the insulating film may also be formed by a gas phase method, such as plasma CVD, thermal CVD, or sputtering. In that case, it is preferable to make the film thickness from 20 to 100 nm (more preferably between 30 and 50 nm). Furthermore, a silicon oxide film, a silicon nitride film, a silicon oxide nitride film, a DLC (diamond like carbon) film, or an organic resin film may also be used. Further, a combined laminate film of these may be used.

Contact holes are formed next in the second interlayer insulating film 167 and in the passivation film 166 in order to reach the drain wiring 165, and the pixel electrode 170 is formed. Note that pixel electrodes 170 and 171 are each separate pixel electrodes for adjoining pixels. A transparent conductive film may be used for the pixel electrodes 170 and 171 for the case of a transmission type liquid crystal display device, while a metallic film may be used for a reflective type liquid crystal display device. A compound film of indium oxide and tin oxide (referred to as ITO film) with a thickness of 110 nm is formed here by sputtering because a transmission type liquid crystal display device is used here.

Further, a storage capacitor 172 is formed at this point where the pixel electrode 170 and the shielding film 168 overlap through the anodic oxide film 169. In this case it is preferable to set the shielding film 168 at floating state (electrically isolated state) or a constant electric potential, more preferably at a common electric potential (median electric potential of image signals sent as data).

Thus, the active matrix substrate, containing the CMOS circuit, which becomes a driver circuit, and the pixel matrix circuit on the same substrate, is completed. Note that in FIG. 4B a p-channel TFT 301, and n-channel TFTs 302 and 303 are formed in the driver circuit, and that a pixel TFT 304 is formed from an n-channel TFT in the pixel matrix circuit.

Note that the process order of embodiment 1 may be properly altered. Whatever the order may be, the basic function of the active matrix substrate does not differ as long as the structure of finally formed TFT is one shown in FIG. 4B, and the effect of the present invention is not impaired.

A channel forming region 201, a source region 202 and a drain region 203 are each formed by a p-type impurity region (a) in the p-channel TFT 301 of the driver circuit. Note that a region that contains phosphorus at a concentration of $1 \times 10^{20}$ to $1 \times 10^{21}$ atoms/cm³ exists in a portion of a source region or a drain region in effect. Further in that region the catalytic element gettered in the process of FIG. 3B exists at a concentration exceeding $5 \times 10^{18}$ atoms/cm³ (typically $1 \times 10^{19}$ to $5 \times 10^{20}$ atoms/cm³).

Further, a channel forming region 204, a source region 205, and a drain region 206 are formed in the n-channel TFT 302, and a region overlapping with the gate wiring by interposing a gate insulating film (such region is referred to as Lov region. 'ov' means overlap) 207 is formed in one side of the channel forming region (drain region side). Here, Lov region 207 contains phosphorus at a concentration of $2 \times 10^{16}$ to $5 \times 10^{19}$ atoms/cm³, and is formed to completely overlap with the gate wiring.

An Lov region is disposed only on one side of the channel forming region 204 (only on the drain region side) in FIG. 4B, in order to reduce resistive constituents as possible. However, it is acceptable to provide Lov regions by sandwiching the channel forming region 204.

A channel forming region 208, a source region 209, and a drain region 210 are formed in the n-channel TFT 303. LDD regions 211 and 212 are formed in both sides of the channel forming region. Note that the regions overlapping with the gate wiring by interposing an insulating film (Lov regions) and the regions that are not overlapped with the gate wiring (such region is referred to as Loff regions. 'off' means offset)

are realized because a portion of the LDD regions 211 and 212 are placed so as to overlap with the gate wiring in this structure.

Figure 6:
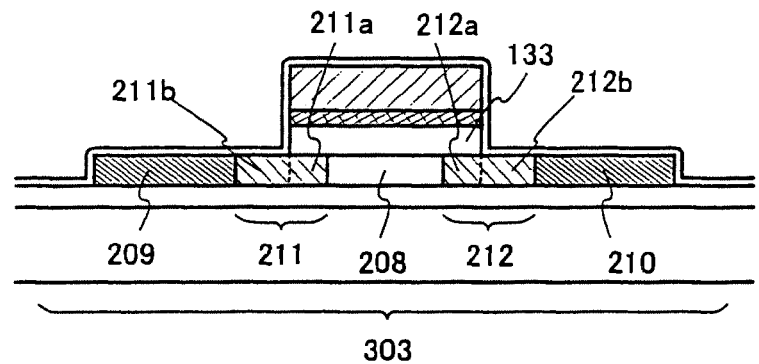
FIG. 6 is a figure showing an LDD structure of n-channel TFT.

A cross sectional view shown in FIG. 6 is an enlarged diagram showing n-channel TFT 303 shown in FIG. 4B in the state of being manufactured to the process of FIG. 3C. As shown here, LDD region 211 is further classified into Lov region 211a and Loff region 211b. Phosphorus is contained in the Lov region 211a at a concentration of $2\times10^{16}$ to $5\times10^{19}$ atoms/cm$^3$, whereas it is contained at a concentration 1 to 2 times as much (typically 1.2 to 1.5 times) in the Loff region 211b.

Further, channel forming regions 213 and 214, a source region 215, a drain region 216, Loff regions 217 to 220, and an n-type impurity region (a) 221 contacting the Loff regions 218 and 219 are formed in the pixel TFT 304. The source region 215, and the drain region 216 are each formed n-type impurity region (a) at this point, and the Loff regions 217 to 220 are formed by n-type impurity region (c).

The structure of the TFTs forming each of the circuits of the pixel circuit and the driver circuits can be optimized to correspond to the required circuit specifications, and the operation performance of the semiconductor device and its reliability can be increased in embodiment 1. Specifically, the LDD region placement in an n-channel TFT is made to differ depending upon the circuit specifications, and by using an Lov region or an Loff region properly, TFT structures with fast operating speeds and which place great importance on measures to counter hot carriers, and TFT structures that place great importance on low off current operation, can be realized on the same substrate.

For the case of an active matrix type liquid crystal display device, for example, the n-channel TFT 302 is suitable for driver circuits that place great importance on high speed, such as a shift register circuit, a frequency divider circuit (a signal divider circuit), a level shifter circuit, and a buffer circuit. In other words, by placing the Lov region in only one side (the drain region side) of the channel forming region, this becomes a structure that reduces the resistive constituents as much while placing great importance on hot carrier countermeasures. This is because, for the case of the above circuit group, the source region and the drain region functions do not change, and the carrier (electron) movement direction is constant. However, if necessary, Lov regions can be placed in both sides of the channel forming region.

Further, the n-channel TFT 303 is suitable for a sampling circuit (also referred to as a transfer gate) which places emphasis on both hot carrier countermeasures and low off current operation. In other words, hot carrier countermeasures can be realized by placement of the Lov region, and in addition, low off current operation is realized by placement of the Loff region. Furthermore, the functions of the source region and the drain region of a sampling circuit reverse, and the carrier movement direction changes by 180°, therefore a structure that has linear symmetry with the center of the gate wiring must be used. Note that it is possible to only form the Lov region, depending upon the circumstances.

Further, the n-channel TFT 304 is suitable for a pixel circuit or a sampling circuit (sample hold circuit) which place great importance on low off current operation. Namely, the Lov region, which is a cause of an increase in the off current value, is not employed, only the Loff region is used, allowing low off current operation to be realized. Furthermore, by utilizing an LDD region with a concentration lower than that of the driver circuit LDD region as the Loff region, although the on current value will fall a little, it is a thorough measure for lowering the off current value. Additionally, it has been confirmed that an n-type impurity region (a) 221 is extremely effective in lowering the off current value.

Further, the length (width) of the Lov region 207 of the n-channel TFT 302 may be between 0.1 and 3.0 µm, typically from 0.2 to 1.5 µm, for a channel length of 3 to 7 µm. Further, the length (width) of the Lov regions 211a and 212a of the n-channel TFT 303 may be from 0.1 to 3.0 µm, typically between 0.2 and 1.5 µm, and the length (width) of the Loff regions 211b and 212b may be from 1.0 to 3.5 µm, typically between 1.5 and 2.0 µm. Moreover, the length (width) of the Loff regions 217 to 220 formed in the pixel TFT 304 may be from 0.5 to 3.5 µm, typically between 2.0 and 2.5 µm.

An input-output signal wiring 305 formed from a laminate structure of the first wiring 11 and the second wiring 13 comprising aluminum, and a gate wiring 306 formed from a laminate structure of the first wiring 12 and the second wiring 14 are formed on the active matrix substrate of embodiment 1. Here, the reason for employing such laminate structure will be explained in the following.

A wiring formed in a long distance such as an input-output signal wiring and a gate wiring is required to have a low resistivity. Specifically in making an active matrix substrate of over diagonal 4 inches, resistive constituents of this long wiring will greatly affect the circuit design. Accordingly, it is desired that the resistivity of the wiring formed in the active matrix substrate be as small as possible.

Therefore in embodiment 1 a measure is taken to reduce the wiring resistivity by laminating a wiring having resistivity of 0.1 to 10 µΩcm like as the second wirings 13 and 14 over a wiring having resistivity of approximately 10 to 500 µΩcm such as the first wirings 11 and 12. In other words, a laminate wiring is employed in which the second wiring having resistivity of 0.1 to 10 µΩcm (typically from 1 to 5 µΩcm) is laminated onto the first wiring having resistivity of 10 to 500 µΩcm (typically 10 to 30 µΩcm). In this case, it is preferable that the resistivity of the second wiring is 1/10 to 1/100 times of resistivity of the first wiring.

Note that the embodiment 1 is characterized in that it uses such structure to a specific sections such as an input-output signal wiring and a portion of the gate wiring. There is a fear that the wiring using above stated laminate structure has a comparatively broad wiring width such as 6 to 8 µm in patterning precision. In such cases it is inappropriate to use them into a gate electrodes that require minute fabrication, or into a connection wiring inside the driver circuit that is integrated in high density.

Further, since the wiring resistivity of a short wiring that connect TFTs inside the driver circuit or of a gate electrode need not be concerned, the function is sufficiently obtained even only with the first wiring. Namely, the wiring formed from the above stated laminate structure may preferably used for a wiring that does not require minute processing, and it is preferable to use only the first wiring in which minute processing is possible for the wiring that requires minute processing even if the resistivity is sacrificed more or less.

The use of a wiring formed from the above stated laminate structure for the input-output signal wiring 305 and the gate wiring (except regions that function as gate electrodes) 306 resides in such reason. Needless to say, the laminate structure may be used without any problem even for the wiring inside the driver circuit and for the gate electrode if the laminate structure may be used (if minute processing is possible).

Another characteristic of the present invention is that the p-channel TFT 301 is formed in self-aligned manner, and n-channel TFTs 302 to 304 are formed in non self-aligned manner.

By using alumina film which has high dielectric constant of 7 to 9 for the dielectric of the storage capacitor in this embodiment, it became possible to reduce the area in which a required capacitor. Further, by using the shielding film formed over pixel TFT as one of the electrodes for the storage capacitor as in embodiment 1, aperture ratio in the image display section of the active matrix liquid crystal display device can be improved.

The structure of the storage capacitor of the present invention is not necessarily limited to the one shown in embodiment 1. For example, the storage capacitor described in Japanese Patent Application Laid-Open No. Hei 9-316567 or Japanese Patent Application Laid-Open No. Hei 10-254097 may be used.

Embodiment 2

Figure 5:
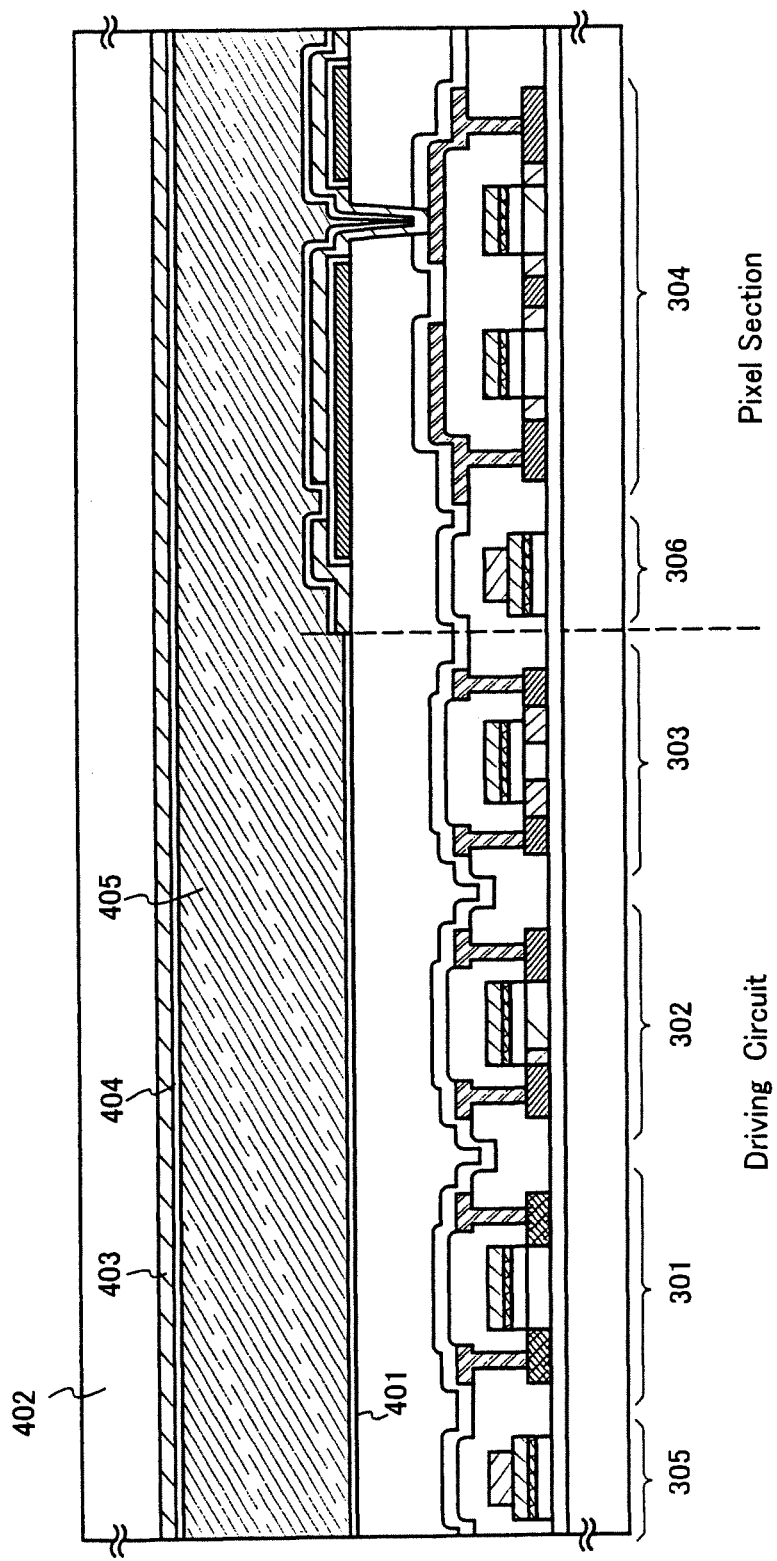
FIG. 5 is a cross sectional structure of an active matrix liquid crystal display device.

A process of manufacturing an active matrix type liquid crystal display device from an active matrix substrate is next explained. As shown in FIG. 5, an alignment film 401 is formed for the substrate in the state of FIG. 4B. In the present embodiment, a polyimide film is used for the alignment film. An opposing electrode 403 comprising transparent conductive film and an alignment film 404 are formed on an opposing substrate 402. Color filter or a shielding film may be formed on the opposing substrate if necessary.

After forming the alignment films, a rubbing process is performed to give the liquid crystal molecules a certain fixed pre-tilt angle, so that they are aligned. The active matrix substrate, on which a pixel circuit and driver circuits are formed, and the opposing substrate are stuck together through a sealing material, spacers, or a resin film provided by patterning (not shown in the figures) in accordance with a known cell assembly process. A liquid crystal material 405 is next injected between both substrates, and the cell is completely sealed by a sealant (not shown in the figures). A known liquid crystal material may be used as the liquid crystal material. Thus the active matrix type liquid crystal display device shown in FIG. 5 is completed.

Figure 7:
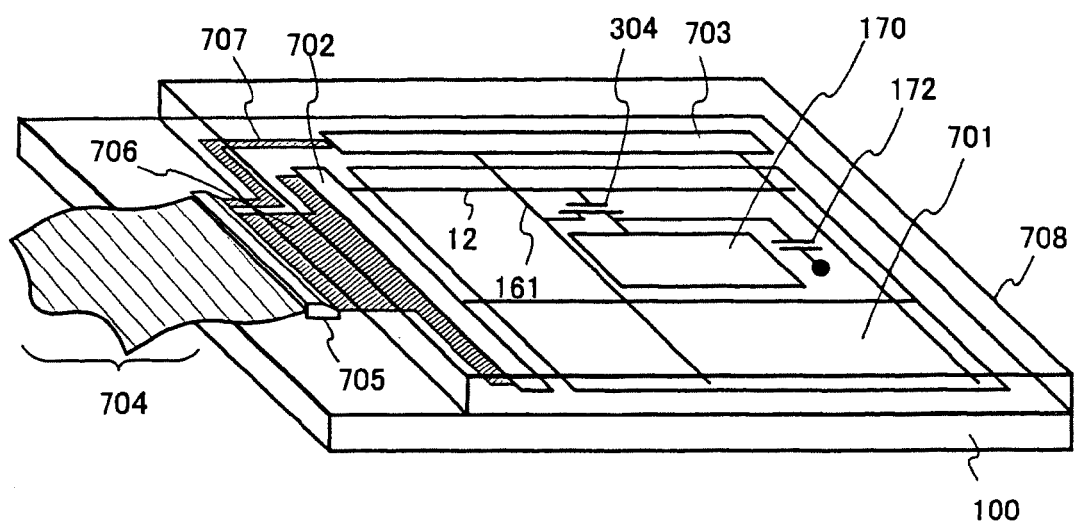
FIG. 7 is a perspective view of an active matrix liquid crystal display device.

The structure of the active matrix liquid crystal display device is next described by referring to the perspective view of FIG. 7. In order to correspond FIG. 7 to cross sectional view of FIGS. 1A to 4B, common reference numerals are used. The active matrix substrate comprises a pixel section 701, scanning (gate) signal driver circuit 702, image (source) signal driver circuit 703 formed over a glass substrate 100. A pixel TFT 304 of the pixel section is an n-channel TFT, and driver circuits disposed to surround the pixel circuit are basically formed from CMOS circuits. Scanning signal driver circuit 702 and image signal driver circuit 703 are respectively connected to the pixel section 701 through gate wiring 306 and source wiring 161. A terminal 705 connected to FPC 704 and the driver circuit are connected through input-output signal wiring 305.

Embodiment 3

Figure 8:
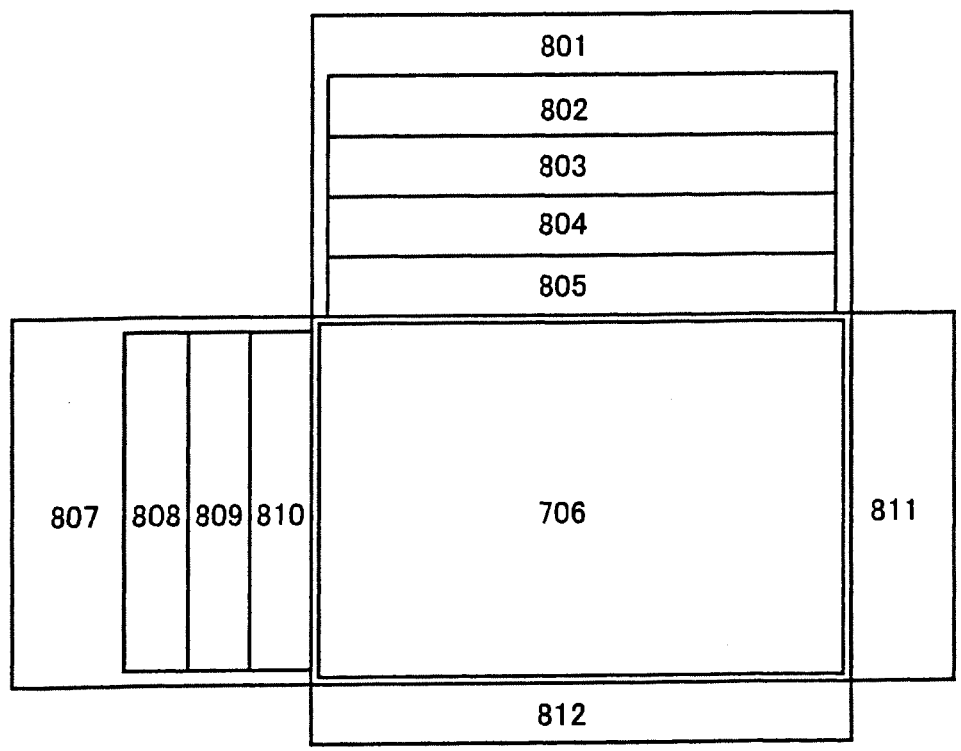
FIG. 8 is a circuit block diagram of an active matrix liquid crystal display device.

FIG. 8 shows an example of circuit structure of the active matrix substrate shown in embodiment 2. The active matrix substrate of embodiment 3 has a image signal driver circuit 801, a scanning signal driver circuit (A) 807, a scanning signal driver circuit (B) 811, a pre-charge circuit 812, and a pixel section 806. Through the Specification, driver circuit is a generic name including image signal driver circuit 801 and a scanning signal driver circuit 807.

The image signal driver circuit 801 is provided with a shift register 802, a level shifter 803, a buffer 804, and a sampling circuit 805. Further, the scanning signal driver circuit (A) 807 is provided with a shift register 808, a level shifter 809, and a buffer 810. The scanning signal driver circuit (B) 811 has a similar structure.

The driver voltages for the shift register 802 and 808 is between 5 and 16 V here (typically 10 V), and the structure shown by reference numeral 302 in FIG. 4B is suitable for n-channel TFTs used in the CMOS circuits forming the shift registers.

Furthermore, the driver voltage becomes high at between 14 and 16 V for the level shifter 803 and 809, and the buffer 804 and 810, but similar to the shift registers, CMOS circuits containing the n-channel TFT 302 shown in FIG. 4B are suitable. Note that using a multi-gate structure, such as a double gate structure and a triple gate structure for the gate wiring is effective in increasing reliability in each circuit.

Further, the sampling circuit 805 has a driver voltage of between 14 and 16 V, but the source region and the drain region are inverted and it is necessary to reduce the off current value, so CMOS circuits containing the n-channel TFT 303 of FIG. 4B are suitable. Note that only the n-channel TFT is shown in FIG. 4B, but in practice the n-channel TFT and a p-channel TFT are combined when forming the sampling circuit.

Further, the pixel section 806 has a driver voltage of between 14 and 16 V, but it is necessary to reduce the off current value even lower than that of the sampling circuit 805. Therefore it is preferable to use a structure in which Lov region is not disposed, and it is preferable to use n-channel TFT 304 of FIG. 4B for the pixel TFT.

Note that the structure of embodiment 3 can be easily realized by manufacturing a TFT according to manufacturing method shown in embodiment 1. Though the embodiment 3 shows only the structures of pixel section and driver circuit, it is possible to form a signal divider circuit, a frequency divider circuit, D/A converter circuit, operational amplifier circuit, γ compensation circuit, and further signal processing circuits (they may also be referred to as logic circuits) such as a memory and a micro processor over a same substrate by following the manufacturing method of embodiment 1.

As stated above, the present invention enables to materialize a semiconductor device comprising a pixel section and a driver circuit for driving the pixel section over a substrate, such as a semiconductor device having a driver circuit and a pixel circuit over a same substrate.

Embodiment 4

In embodiment 4 pixel structures of the pixel section that may be fabricated according to manufacturing process of embodiment 1, are described by referring to FIG. 9. Note that pixel TFTs of double gate structure are shown in all of the examples in embodiment 4 but other multi-gate structures such as a triple gate structure may be used or a single gate structure may be used.

Figure 9A:
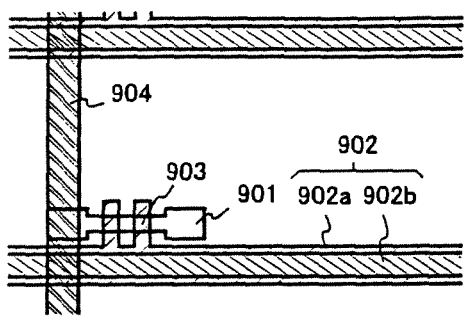
FIGS. 9A to 9D are figures showing structure from top view of pixel section.

In FIG. 9A, 901 is an active layer; 902, gate wiring comprising the first wiring 902a and the second wiring 902b; 903, gate electrode formed from only the first wiring 902a; and 904, source wiring.

Figure 9B:
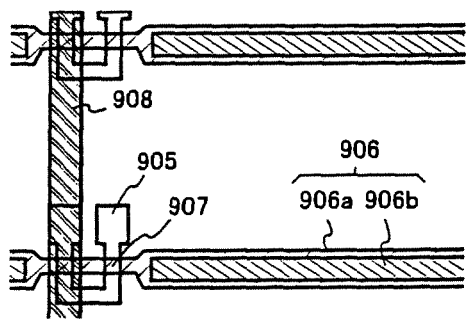

In FIG. 9B, 905 is an active layer; 906, gate wiring comprising the first wiring 906a and the second wiring 906b; 907, gate electrode formed from only the first wiring 906a; and 908, source wiring.

Figure 9C:
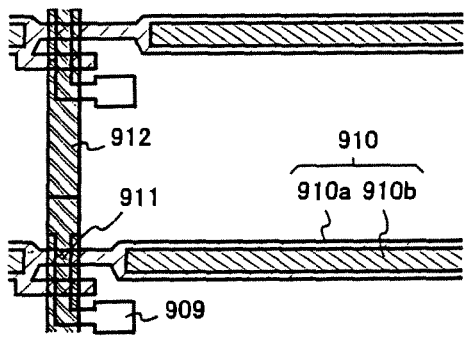

In FIG. 9C, 909 is an active layer; 910, gate wiring comprising the first wiring 910a and the second wiring 910b; 911, gate electrode formed from only the first wiring 910a; and 912, source wiring.

Figure 9D:
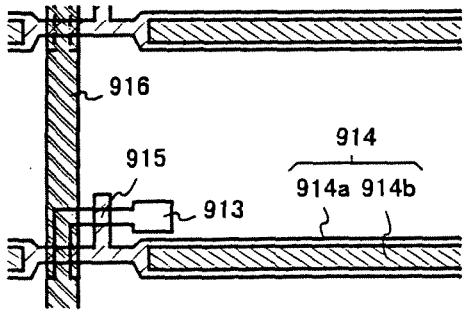

In FIG. 9D, 913 is an active layer; 914, gate wiring comprising the first wiring 914a and the second wiring 914b; 915, gate electrode formed from only the first wiring 914a; and 916, source wiring.

As shown above, the structure of the present invention can be used for any pixel structure. Note that the structure of embodiment 4 can be realized in accordance with embodiment 1, and can be combined with any of the structure of embodiment 2 and 3.

Embodiment 5

In embodiment 5 a pixel structure of the pixel section that can be fabricated in accordance with the manufacturing process of embodiment 1 is explained by using FIG. 10. Needless to say, while embodiment 5 shows an example of a triple gate structured pixel TFT, it may be a double gate structure or a single gate structure.

Figure 10A:
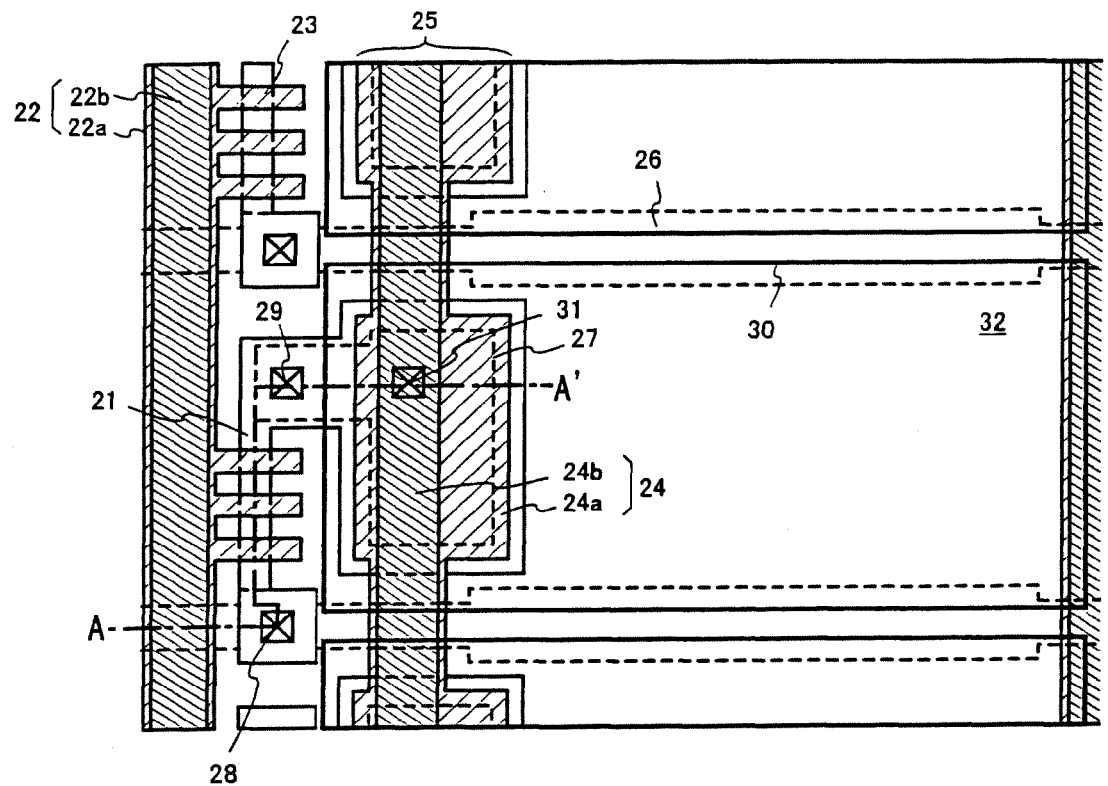
FIGS. 10A and 10B are a top view and a cross sectional view of pixel section respectively.
Figure 10B:
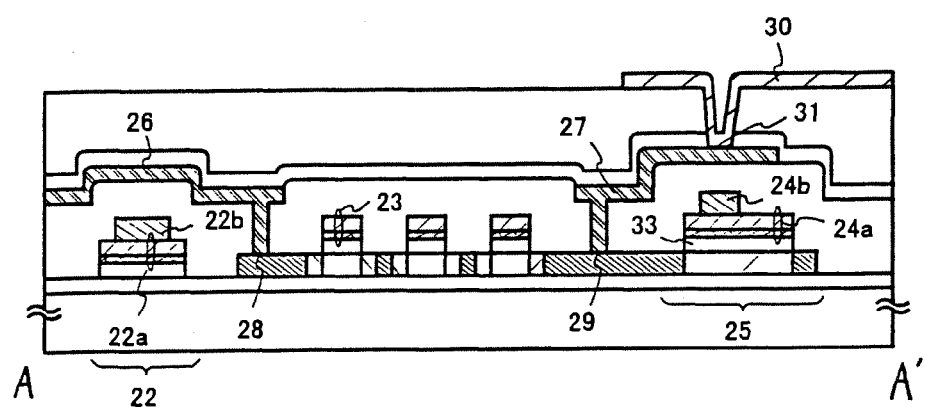

A cross sectional diagram along A-A' line in the top view shown in FIG. 10A corresponds to FIG. 10B. In FIG. 10A: 21 is an active layer; 22, gate wiring comprising first wiring 22a and second wiring 22b; 23, gate electrode formed from only first wiring 22a (reference numeral is applied onto only one of the 3 gate electrodes); 24, capacitance wiring comprising first wiring 24a and second wiring 24b.

The first wiring 24a that forms the capacitance wiring is formed so as to largely overlap with a portion of the active layer 21. There is an insulating film (dielectric of storage capacitor) 33 that was formed at the same time with the gate insulating film (the same layer and comprised of the same material), in between the first wiring 24a and the active layer 21, and there is formed a storage capacitor 25.

In addition, 26 is source wiring; 27, drain wiring; 28, contact section between source wiring and active layer; 29, contact section between drain wiring and active layer; 30, pixel electrode (transparent conductive film in embodiment 5); 31, contact section between pixel electrode and drain wiring; and 32, image display region.

Embodiment 5 is characterized by using the laminated wiring of the first wiring and the second wiring that is used for input-output signal wiring and gate wiring, also for capacitance wiring. By doing so the electric potential of the capacitance wiring can be more stabilized, and accurate expression of gray scale is made possible in case of liquid crystal display device.

Note that the structure of embodiment 5 can be realized in accordance with embodiment 1, and can be combined with any of the structure of embodiment 2 to 4.

Embodiment 6

Figure 11:
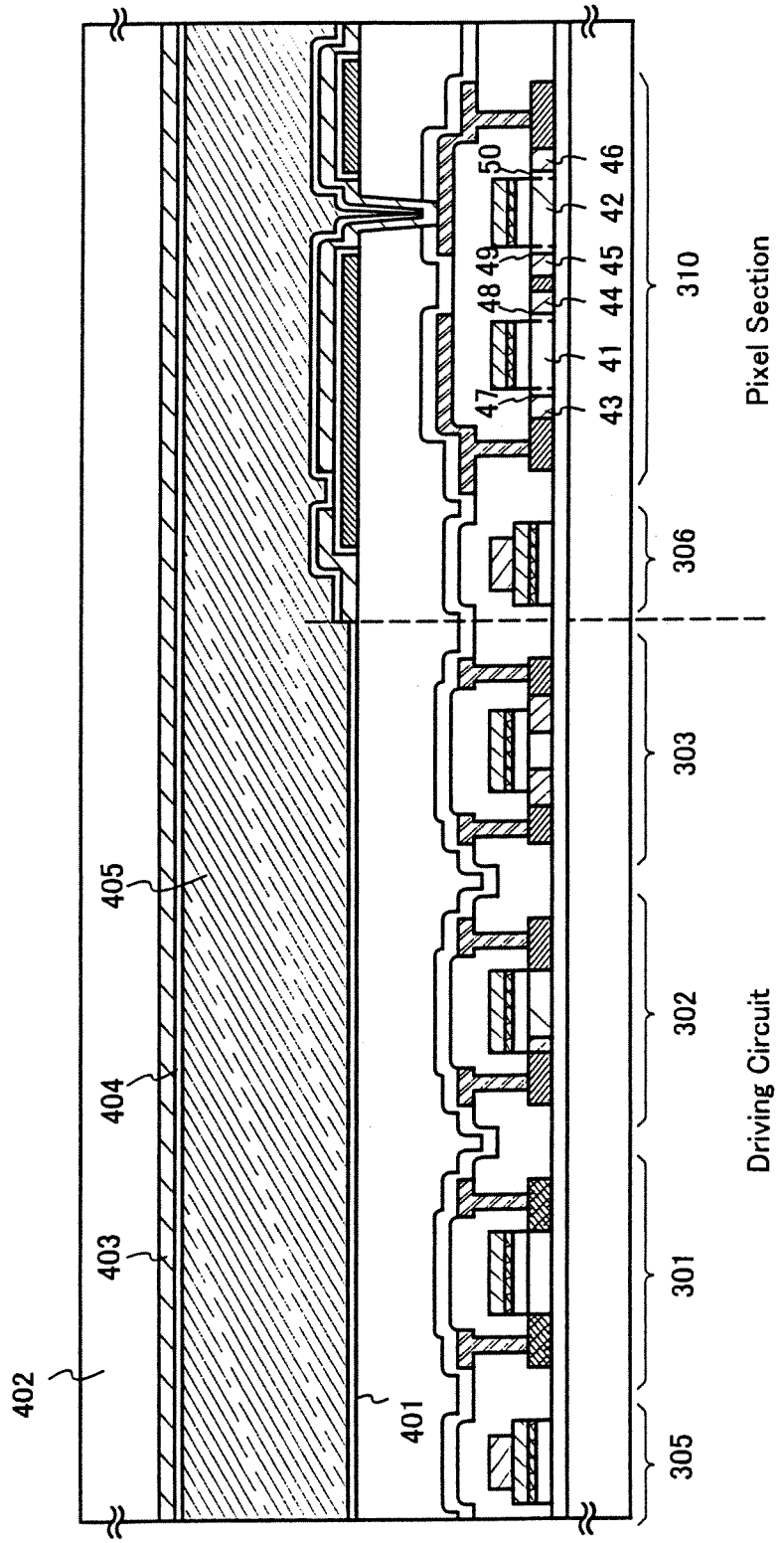
FIG. 11 is a cross sectional structure of an active matrix liquid crystal display device.

In embodiment 6 an active matrix liquid crystal display device having a pixel section of a structure different from that of embodiment 1 is described by using FIG. 11. Note that the basic structure is the same as FIG. 5, and description is made by concentration on only the parts that differ.

The structure of pixel TFT (n-channel TFT) 310 that form the pixel section differ from embodiment 1 in the structure of FIG. 11. In concrete, embodiment 6 differ in that offset regions 47 to 50 are formed between channel forming regions 41 and 42 and LDD regions formed by n-type impurity region (c) 43 to 46.

Note that an offset region designates a region that is a semiconductor layer of the same constitution with a channel forming region, and do not overlap with a gate electrode, as shown by 47 to 50. These offset regions 47 to 50 function simply as a resistant, and are very effective in reducing off current value.

In order to realize such structure, an insulating film comprising silicon may be formed into 20 to 200 nm thickness (preferably 25 to 150 nm) to cover gate wiring etc. prior to doping of n-type impurity element in the process of FIG. 2D of embodiment 1, for example.

Impurity elements are doped in the state in which an insulating film comprising silicon is formed in the side wall of gate electrode 124, and an offset region is formed with that section functioned as a mask. Accordingly the length of the offset region thus formed almost coincide with the thickness of the insulating film comprising silicon, and become 20 to 200 nm (preferably 25 to 150 nm).

The insulating film comprising silicon has already been described in embodiment 1, but it is preferable to use the same material as the gate insulating film in embodiment 6 so that it can be removed at the same time with the gate insulating film in the process of FIG. 2E.

Note that the structure of embodiment 6 can be realized by alternating a part of embodiment 1, and can be combined with any of the structure of embodiment 2 to 5.

Embodiment 7

In embodiment 7 a case of manufacturing an active matrix substrate by a manufacturing process different from embodiment 1 is described by using FIG. 12A to 12C.

First, processes up to FIG. 3C are performed in accordance with the manufacturing process of embodiment 1. Note however that while embodiment 1 used a 50 nm thick silicon nitride film as the protection film, embodiment 7 uses a 300 nm thick silicon oxide nitride film 51. (FIG. 12A)

Contact holes are opened in the silicon oxide nitride film 51 on first electrode 11 that will become input-output signal wiring and first electrode 12 that will become gate wiring. Second wirings 53 and 54 having low resistivity are formed by a film formed from aluminum as its principal component (aluminum film added with 2 wt % of silicon in embodiment 7). (FIG. 12B)

Thus an active matrix substrate having a driver circuit and a pixel section and structured by FIG. 12C is completed. In FIG. 12C, p-channel TFT 320, n-channel TFTs 321 and 322 are formed in the driver circuit, and a pixel TFT 323 formed by n-channel TFT is formed in the pixel section. Further, input-output signal wiring 324 and gate wiring 325 are formed.

The functions of these TFTs 320 to 323, input-output signal wiring 324 and gate wiring 325 are as described in embodiment 1, therefore the description is omitted here. The different points with the active matrix substrate shown in FIG. 4B of embodiment 1 are: that the protection film 51 is remained, and that the structure of input-output signal wiring 324 and gate wiring 325 differed. Therefore, in regard to the function and the effect, those of similar to embodiment 1 can be obtained.

Note that it is needless to say that an active matrix liquid crystal display device is completed by combining embodiment 7 with embodiment 2, and that it is possible to freely combine with any structure of embodiments 3 to 6.

Embodiment 8

In the structure shown in embodiment 1, any low resistive material may be used as the second wiring. In concrete, copper or a film having copper as its main component (hereinafter referred to as copper type thin film), silver or a film having silver as its main component (hereinafter referred to as silver type thin film), or a laminate film combining these can be used other than aluminum or a film having aluminum as its main component (hereinafter referred to as aluminum type thin film) shown in embodiment 1.

Moreover, a film formed from a material such as titanium, titanium nitride, tantalum, tantalum nitride, tungsten, tungsten nitride, molybdenum, niobium, etc., may be laminated onto the above stated aluminum type thin film, copper type thin film or aluminum type thin film. The laminating order may be either upper or lower, and a structure in which the second wiring is sandwiched may also be employed. These films are specifically effective in the case of using aluminum type thin film as the second wiring, and can prevent generation of hillocks etc.

Further, above stated aluminum type thin film, copper type thin film or aluminum type thin film are materials that are very easily oxidized and cause insulation defect. Therefore by laminating above stated thin film of titanium etc. on the upper surface of the second wiring the electric contact with other wirings may become easier.

Note that the structure of embodiment 8 can be freely combined with any structure of embodiment 2 to 7 in addition to embodiment 1.

Embodiment 9

While embodiment 1 showed an example of using catalytic element that promotes crystallization as a method of forming the semiconductor film including crystalline structure, embodiment 9 shows a case of forming the semiconductor film including crystalline structure by thermal crystallization or by laser crystallization without using the catalytic element.

In case of using thermal crystallization, heat treatment at 600 to 650° C. for 15 to 24 hours may be performed after forming a semiconductor film including amorphous structure. Namely, crystallization proceeds from natural nucleus formation by performing heat treatment at a temperature exceeding 600° C.

In case of laser crystallization, laser annealing process may be performed in the first annealing condition shown in embodiment 1 after forming a semiconductor including amorphous structure. By doing so, a semiconductor that include crystalline structure can be formed in a short time. Needless to say, a lamp annealing may be performed in place of the laser annealing.

As shown above, the semiconductor film including crystalline structure used in the present invention can be formed by using any publicly known means. Note that the structure of embodiment 9 can be freely combined with the structures of embodiment 1 to 8.

Embodiment 10

A case of forming an active matrix substrate from a different manufacturing process from that of embodiment 1 is described in embodiment 10.

In embodiment 1, a technique in which crystallization process is performed by using the technique disclosed in Japanese Patent Application Laid-Open Hei 7-130652 and then gettering the catalyst element used in the crystallization into source and drain regions at the same time with activation of source and drain regions, was used.

However it is also possible to use the technique disclosed in Japanese Patent Application Laid-Open Hei 10-270363 (corresponding to U.S. patent application Ser. No. 09/050,182) for the processes of crystallization through gettering. In the case of using the technology disclosed in this gazette, after performing crystallization process using catalyst element, a region containing an element belonging to periodic table group 15 (typically phosphorus) is selectively formed and the catalyst element is gettered into the region.

Further as another method, it is possible to use the technique disclosed in Japanese Patent Application Laid-Open No. Hei 10-247735 (corresponding to U.S. patent application Ser. No. 09/034,041) for the processes from crystallization process through gettering process.

As described above, the semiconductor film including crystallization structure used in the present invention may be formed from various methods from public domain. Note that the structure of embodiment 10 can be freely combined with the structures of embodiments 1 to 8.

Embodiment 11

In the present invention, wiring resistance is reduced by applying a laminated structure comprising the first wiring and the second wiring to gate wirings and/or capacitor wirings as shown in FIG. 10. Here, FIG. 1 shows a case of using the laminated layer having the first wiring comprising TaN/Ta layer (laminated layer comprising tantalum nitride layer and tantalum or a tungsten layer as, and the second wiring comprising Al—Nd layer (aluminum layer added neodymium).

Incidentally, while forming the first and the second wiring in this embodiment, hest treatment is performed in nitrogen atmosphere containing oxygen at a concentration of 1 ppm or less at 500° C. fro 4 hours after forming the first wiring, and then the second wiring is formed on the first wiring. After that, we measured the sheet resistance.

As shown by Chart 1, although the sheet resistance in case of using a single layer comprising TaN/TaN layer is 8Ω/□, the sheet resistance in case of laminating the Al—Nd layer thereon is reduced to 0.16Ω/□. Moreover, this feature means that a good electric contact is formed in spite of performing a heat treatment under the condition of exposing the first wiring.

Embodiment 12

Figure 22:
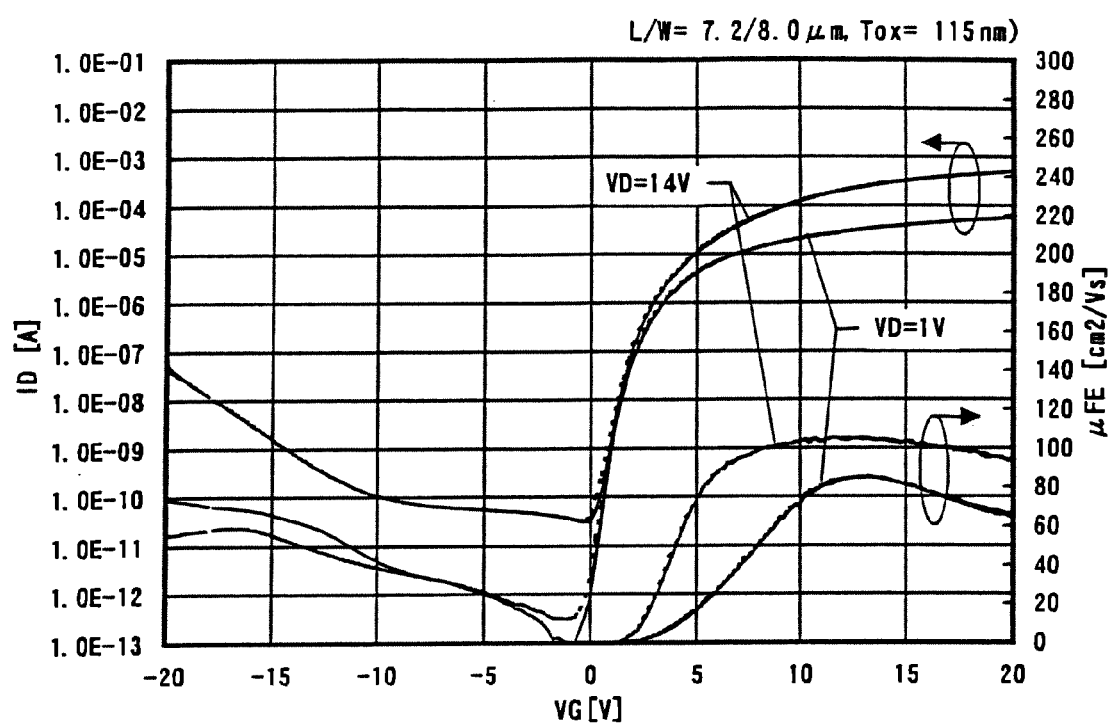
FIG. 22 is a graph showing ID-VG curve and a field effect mobility of n-channel TFT.

FIG. 22 shows a graph of relationship between drain current (ID) and gate voltage (VG) of the n-channel TFT 302 fabricated by the process steps according to the Embodiment 1 (Hereinafter, ID-VG curve), and relationship between field effect mobility ($\mu_{FE}$) and the gate voltage (VG) of the n-channel TFT. Here, a source voltage (VS) is 0V and a drain voltage (VD) is 1V or 14V. Incidentally, the n-channel TFT has a channel length (L) of 7.2 μm, a channel width (W) of 8.0 μm and a thickness of a gate insulating film (Tox) of 120 nm.

FIG. 22 shows the ID-VG curve and the field effect mobility in which the bold lines represent the characteristic before a stress test and the dotted lines represent the characteristic after the stress test. This graph proves that there is little changes in the ID-VG curve before and after the stress test and the degradation owing to hot carriers is restrained. Incidentally, the stress test here is performed under the condition that a source voltage at 0V, a drain voltage at 20V and a gate voltage at 4V are applied for 60 seconds at a room temperature, in order to promote the degradation owing to the hot carriers.

Embodiment 13

It is possible to use the present invention when forming an interlayer insulating film on a conventional MOSFET, and then forming a TFT on that. In other words, it is possible to realize a semiconductor device with a three dimensional structure. Further, it is possible to use an SOI substrate such as SIMOX, Smart-Cut (a trademark of SOITEC corporation), or ELTRAN (a trademark of Cannon, Inc.)

Note that it is possible to freely combine the structure of embodiment 11 with the structure of any of embodiments 1 to 10.

Embodiment 14

It is possible to use a variety of liquid crystal materials in a liquid crystal display device manufactured in accordance with the present invention. The following can be given as examples of such materials: a TN liquid crystal; PDLC (polymer diffusion type liquid crystal); an FLC (ferroelectric liquid crystal); an AFLC (antiferroelectric liquid crystal); and a mixture of an FLC and an AFLC.

For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; S. Inui et al., "Thresholdless antiferroelectricity in liquid crystals and its application to displays, 671-673, J. Mater. Chem. 6(4), 1996; and in U.S. Pat. No. 5,594,569 can be used.

In particular, among an antiferroelectric liquid crystal material with no threshold value (thresholdless antiferroelectric LCD: abbreviated TL-AFLC) that shows electrooptical response characteristic in which transmittance is continuously varied against electric field, is used, there are some that show V-shaped (or U-shaped) electrooptical response characteristic, and even liquid crystals whose operating voltage is approximately ±2.5 V are found. Accordingly there are some cases where power supply voltage for the pixel section is on the order of 5 to 8 V and that indicates a possibility of driving the driver circuit and the pixel circuit with the same power supply voltage. Namely, the entire liquid crystal display device can be made low power consumption.

Further, ferroelectric liquid crystals and anti-ferroelectric liquid crystals possess an advantage in that they have a high response time compared to TN liquid crystals. Since TFTs used in the present invention can achieve TFTs whose operation speed is very fast, it is possible to realize a liquid crystal display device having fast image response speed in which fast response speed of ferroelectric liquid crystal and antiferroelectric liquid crystal is sufficiently utilized.

Further, thresholdless antiferroelectric mixed liquid crystal has large spontaneous polarization in general, and the dielectric constant of liquid crystal itself is large. Therefore, comparatively large storage capacitor is required in the pixel in case of using thresholdless antiferroelectric mixed liquid crystal for a liquid crystal display device. It is preferable to use thresholdless antiferroelectric mixed liquid crystal having small spontaneous polarity. From this point of view, the storage capacitor shown in FIG. 4B of embodiment 1 is preferable because it can store a large capacitance in a small area.

It is needless to say that the use of liquid crystal display device of embodiment 12 for display of electronic devices such as personal computer etc. is effective.

The structure of the present invention can be freely combined with any structure of embodiment 1 to 10 and 13.

Embodiment 15

It is possible to apply the present invention to an active matrix type EL display. An example of this is shown in FIG. 13.

Figure 13:
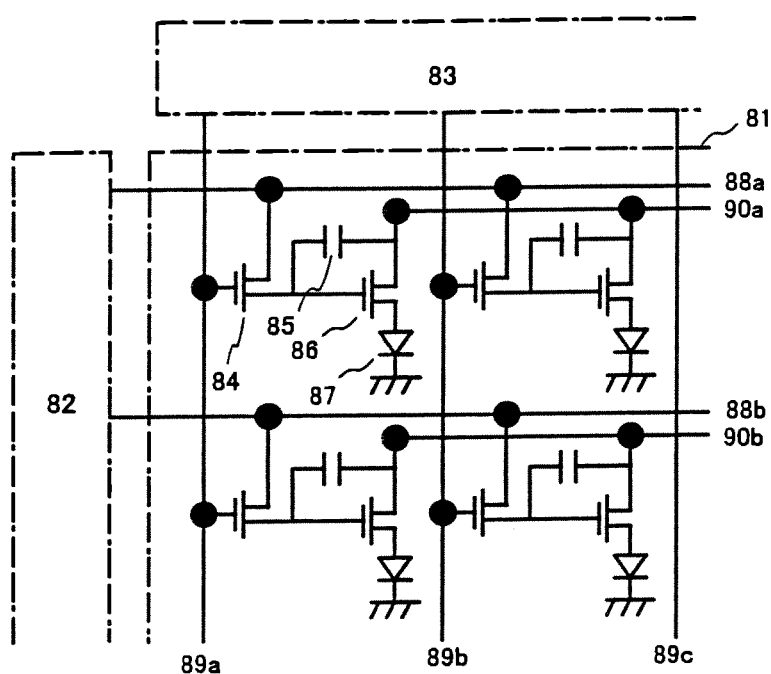
FIG. 13 is a figure showing a structure of an active matrix EL display device.

FIG. 13 is a circuit diagram of an active matrix type EL display. Reference numeral 81 denotes a display region, and an x-direction (source side) driver circuit 82 and a y-direction (gate side) driver circuit 83 are disposed in the peripheral. Further, each pixel in the display region 81 has switching TFT 84, a capacitance 85, a current controlling TFT 86, and an EL element 87, and the switching TFT 84 is connected to x-direction signal lines (source signal lines) 88*a* (or 88*b*) and to y-direction signal lines (gate signal lines) 89*a* (or 89*b*, 89*c*). Furthermore, power supply lines 90*a* and 90*b* are connected to the current controlling TFT 86.

In an active matrix EL display of the embodiment 15, an x-direction driver circuit 82 and a y-direction driver circuit 83 are formed by combining p-channel TFT 301 and n-channel TFT 302 or 303 of FIG. 4B. N-channel TFT 304 of FIG. 4B is used for switching TFT 84 and p-channel TFT 301 is used for current controlling TFT 86. Needless to say, the combination of TFT need not be limited to the above.

Any structure of embodiments 1 to 10, 13 and 14 to the active matrix EL display of embodiment 15.

Embodiment 16

Figure 14A:
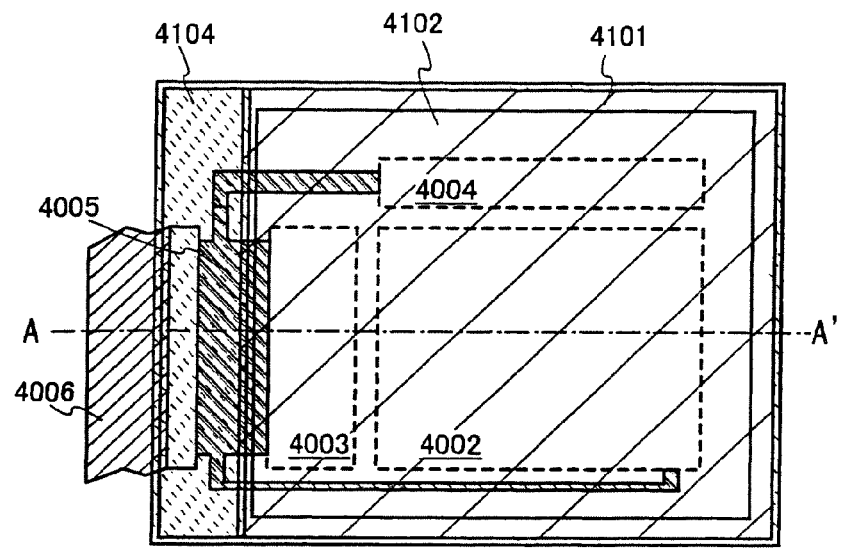
FIGS. 14A and 14B are a top view and a cross section, respectively, of an EL display device.

An explanation of the example of the manufacture of an active matrix type EL (electro-luminescence) display device using the present invention is given in embodiment 16. FIG. 14A is a top view of an EL display device using the present invention, and FIG. 14B is a cross sectional diagram of the display.

In FIG. 14A, reference numeral 4001 denotes a substrate, 4002 denotes a pixel section, 4003 denotes a source side driver circuit, and 4004 denotes a gate side driver circuit. Each of the drive circuits is lead to an FPC (flexible print circuit) 4006 through wiring 4005, and thus connected to external equipment.

First sealing material 4101, cover material 4102, fillers 4103 and second sealing material 4104 are provided to surround the pixel section 4002, source side driver circuit 4003 and gate side driver circuit 4004.

Figure 14B:
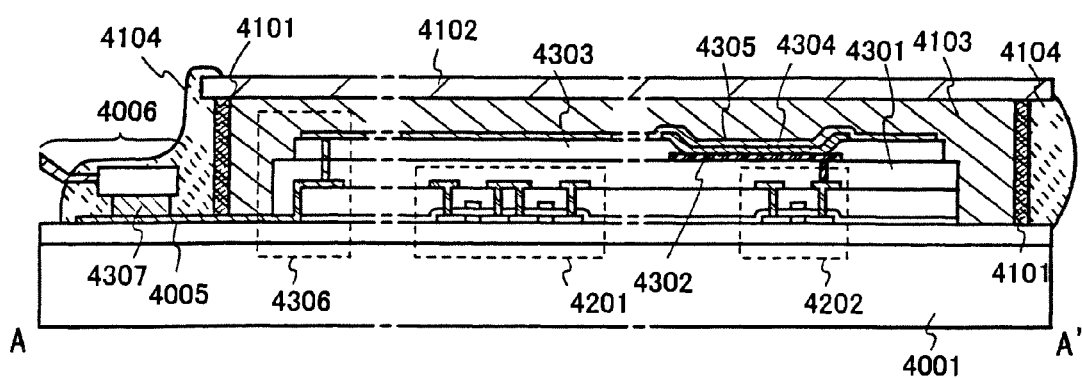

FIG. 14B corresponds to a diagram of cross section at A-A' of FIG. 14A. A driver circuit TFT (an n-channel TFT and a p-channel TFT are shown here) 4201 that comprises a source side driver circuit 4003 and a current control TFT (TFT that controls the current to the EL) that comprises a pixel section 4002 are formed over the substrate 4001.

TFTs of the same structures as p-channel TFT 301 and n-channel TFT 302 of FIG. 4B are used for driver TFT 4201 and TFT of the same structure as p-channel TFT 301 of FIG. 4B is used for current control TFT 4202 in embodiment 14. A storage capacitor (not shown) connected to the gate of current control TFT 4020 is provided in pixel section 4002.

An interlayer insulating film (a planarization film) 4301 made of resin material is formed over driver TFT 4201 and pixel TFT 4202. Pixel electrode (anode) 4302 is formed thereon that is connected to the drain of pixel TFT 4202. A transparent conductive film having a large work function is used as the pixel electrode 4302. A compound of indium oxide and tin oxide (called ITO), or a compound of indium oxide and zinc oxide can be used as the transparent conductive film.

An insulating film 4303 is formed on pixel electrode 4302, and an opening is formed in insulating film 4303 at an area over pixel electrode 4302. EL (electro-luminescence) layer 4304 is formed on pixel electrode 4302 in the opening section. A publicly known organic EL material or inorganic EL material can be used for the EL layer 4304. There are monomer type material and polymer type material in the organic material, and either can be used.

The formation method of EL layer 4304 may apply publicly known evaporation technique or coating technique. The structure of EL layer may be a single layer structure or a laminate structure in which hole injection layer, hole transport layer, illumination layer, electron transport layer and electron injection layer are freely combined.

A cathode 4305 comprising a conductive film having light shielding property (typically a conductive film whose principal component is aluminum, copper or silver, or a laminate film of these and other conductive film) is formed over EL layer 4304. It is preferable to remove as much as possible of the moisture and oxygen existing in the interface between the cathode 4305 and the EL layer 4304. Therefore, it is necessary to form these films continuously in a vacuum, or to form the EL layer 4304 in a nitrogen atmosphere or in a noble gas and then form cathode 4305 keeping out the contact of oxygen and moisture. In embodiment 14 deposition described above is enabled by using deposition apparatus of multi-chamber method (cluster-tool method).

Cathode 4305 is connected to wiring 4005 in the region shown as 4306. Wiring 4005 is a wiring for applying a determined voltage to the cathode 4305 and is connected to FPC 4006 through anisotropic conductive film 4307.

As described above, EL elements comprising pixel electrode (anode) 4302, EL layer 4304 and cathode 4305 are formed. EL elements are surrounded by a first sealing material and a cover material 4012 stacked to substrate 4001 by first sealing material 4101, and sealed with fillers 4103.

As the cover material 4102, glass plate, metal plate (typically stainless plate), ceramics plate, FRP (fiberglass-reinforced plastics) plate, PVF (polyvinyl fluoride) film, Myler film, polyester film or acrylic film can be used. Further, a sheet having a structure in which aluminum foil is sandwiched by PVF film or Myler film.

Provided, the cover material need to be transparent in case that radiation from EL elements are directed to the direction toward cover material. In such cases, transparent substances such as glass plate, plastic plate, polyester film or acrylic film are used.

A ultraviolet ray curing resin or a thermosetting resin can be used as filler 4103, and PVC (polyvinyl chloride), acrylic, polyimide, epoxy resin, silicone resin, PVB (polyvinyl butyral), or EVA (ethylene vinyl acetate) can be used. If a drying agent (preferably barium oxide) is formed on the inside of the filler 4103, deterioration of EL elements can be prevented.

Further, spacers may be included within the filler 4103. When the spacers are formed of from barium oxide, it is possible to give the ability to absorb moisture to the spacers themselves. In addition, it is effective to provide a resin film over cathode 4305, as a buffer layer that releases pressure from the spacers in case of disposing the spacers.

The wiring 4005 is electrically connected to the FPC 4006 through anisotropic conductive film 4307. Wiring 4005 transmits signals that are sent to pixel section 4002, source side driver circuit 4003 and gate side driver circuit 4004 from FPC 4006, and is electrically connected to an external device by FPC 4006.

In embodiment 16 a structure that thoroughly shields the EL elements from external atmosphere is employed in which second sealing material 4104 is provided so as to cover the exposed portions of first sealing material 4101 and a part of FPC 4006. Thus an EL display device having a cross sectional structure of FIG. 14B is complete. Note that EL display device of embodiment 16 may be fabricated in combination with any structure of embodiments 1 to 10 and 13 to 15.

Figure 15:
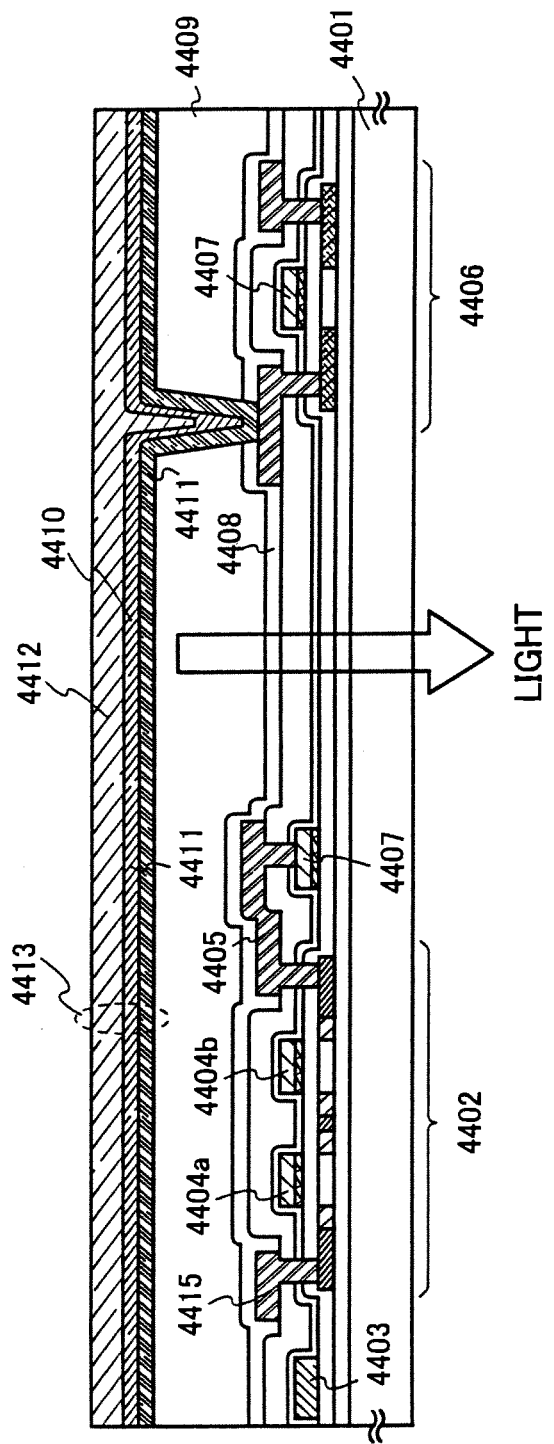
FIG. 15 is a figure showing a cross section of an EL display device.
Figure 16A:
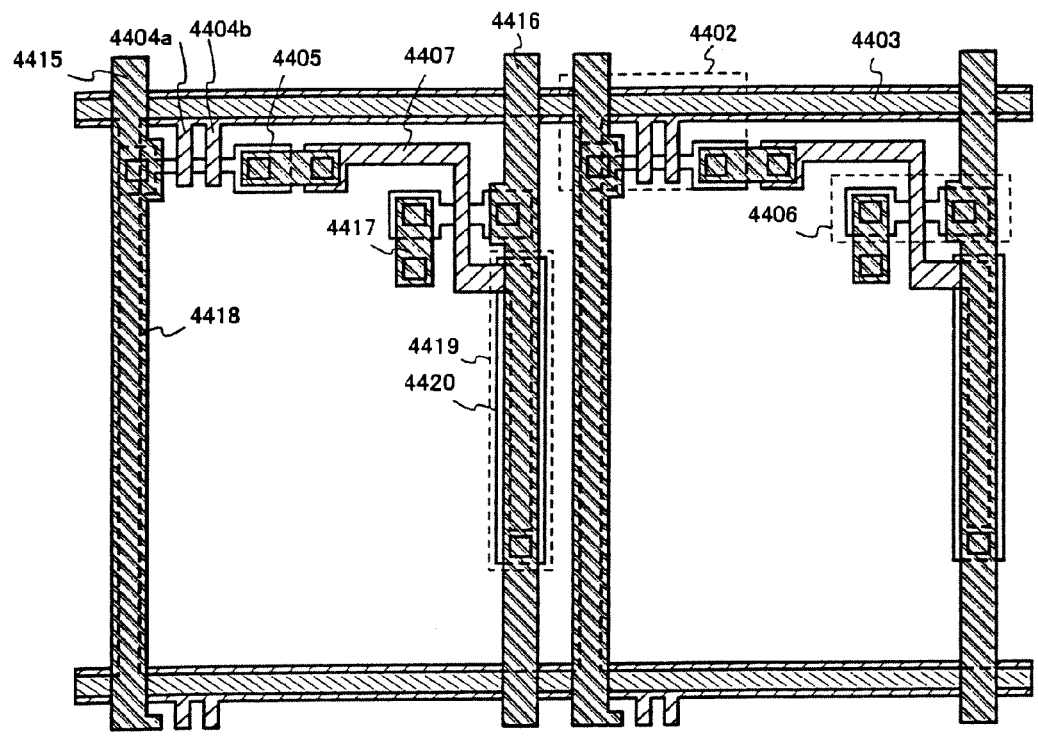
FIGS. 16A and 16B are figures of a top view and a circuit diagram of an EL display device.
Figure 16B:
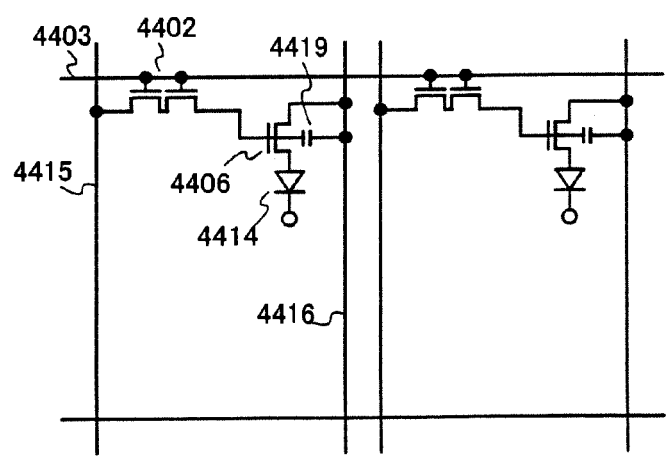

A more detailed structure on a cross section of pixel section is shown in FIG. 15, a top view if shown in FIG. 16A, and circuit diagram is shown in FIG. 16B. Common reference numerals are used in FIGS. 15, 16A and 16B, so that the figures may be compared with each other.

In FIG. 15, switching TFT 4402 disposed over substrate 4401 comprises an n-channel TFT 304 of FIG. 4B. Accordingly, the description of n-channel TFT 304 may be referred, regarding the description of the structure. The wiring shown by 4403 is a gate wiring that electrically connects gate electrodes 4404a and 4404b of switching TFT 4402.

While embodiment 16 uses a double gate structure in which 2 channel forming regions are formed, a single gate structure in which a channel forming region is formed or a triple gate structure in which 3 channel forming regions are formed may also be used.

The drain wiring 4405 of switching TFT 4402 is electrically connected to gate electrode 4407 of current control TFT 4406. Note that current control TFT is comprised of a p-channel TFT 301 of FIG. 4B. Accordingly, the description of p-channel TFT 301 may be referred, as to the structure. Note that while embodiment 16 uses a double gate structure, a single gate structure or a triple gate structure may also be used.

A first passivation film 4408 is disposed over the switching TFT 4402 and the current control TFT 4406, and a planarization film 4409 comprising resin is formed on top. It is very important to flatten by using the planarization film 4409, the step due to the TFTs. Since an EL layer formed later is extremely thin, there are cases in which defective luminescence is caused due to the existence of the step. Therefore, it is preferable to planarize before forming pixel electrode so as to form an EL layer on a planarized surface as possible.

The reference numeral 4410 denotes a pixel electrode (anode of EL element) comprising a transparent conductive film, and is electrically connected to the drain wiring 4411 of current control TFT 4406. A compound comprising indium oxide and tin oxide or a compound comprising indium oxide and zinc oxide can be used as pixel electrode 4410.

An EL layer 4412 is formed on pixel electrode 4410. Note that while FIG. 15 shows only 1 pixel, EL layers corresponding to each colors of R (red), G (green) and B (blue) are each formed properly in embodiment 14. A monomer type organic EL material is formed by evaporation in embodiment 14. In concrete, a laminate structure is formed from a copper phthalocyanine (CuPc) film of 20 nm disposed as a hole injection layer, and tris-8-quinolinolate aluminum complex ($Alq_3$) film formed thereon into 70 nm thickness as a luminescent layer. A luminescent color may be controlled by adding fluorescent dye such as quinacridon, or DCM1 into $Alq_3$.

However, the above example is one example of the organic EL materials that can be used as luminescence layers, and it is not necessary to limit to these materials. An EL layer (a layer for luminescence and for performing carrier motion for luminescence) may be formed by freely combining luminescence layer, charge transport layer, or charge injection layer. For example, an example using monomer type materials as luminescence layers is shown in embodiment 16, but polymer type organic EL materials may also be used. Further, it is possible to use inorganic materials such as silicon carbide, etc., as charge transport layer and charge injection layer. Publicly known materials can be used for these organic EL materials and inorganic materials.

A cathode 4413 comprising a conductive film having light shielding property is next formed on EL layer 4412. In the case of embodiment 16, an alloy film of aluminum and lithium is used as the conductive film having light shielding property. Needless to say, a publicly known MgAg film (alloy film of magnesium and silver) may also be used. As the cathode material, a conductive film comprising an element belonging to periodic table group 1 or 2, or a conductive film added with at least one of these elements, may be used.

EL element 4414 is completed at the point when this cathode 4413 is formed. Note that an EL element 4414 formed here represents a capacitor comprising pixel electrode (anode) 4410, EL layer 4412 and cathode 4413.

The top structure of the pixel in embodiment 16 is next described by using FIG. 16A. Source region of switching TFT 4402 is connected to source wiring 4415 and drain region is connected to drain wiring 4405. Further, drain wiring 4405 is electrically connected to gate electrode 4407 of current control TFT 4406. Source region of current control TFT 4406 is electrically connected to current supply line 4416 and drain region is electrically connected to drain wiring 4417. Drain wiring 4417 is electrically connected to pixel electrode (anode) 4418 shown by dotted line.

Here, a storage capacitor is formed in the region shown by 4419. Storage capacitor 4419 is formed from a semiconductor film 4420 electrically connected to current supply line 4416, a gate insulating film formed of the same layer as gate insulating film (not shown) and gate electrode 4407. Further, it is possible to use a capacitance formed from gate electrode 4407, a layer formed from the same layer as the first interlayer insulating film (not shown) and current supply line 4416, for a storage capacitor.

In fabricating an EL display device of embodiment 16, the structures of embodiment 1 to 10 and 13 to 15 may be freely combined.

Embodiment 17

Figure 17:
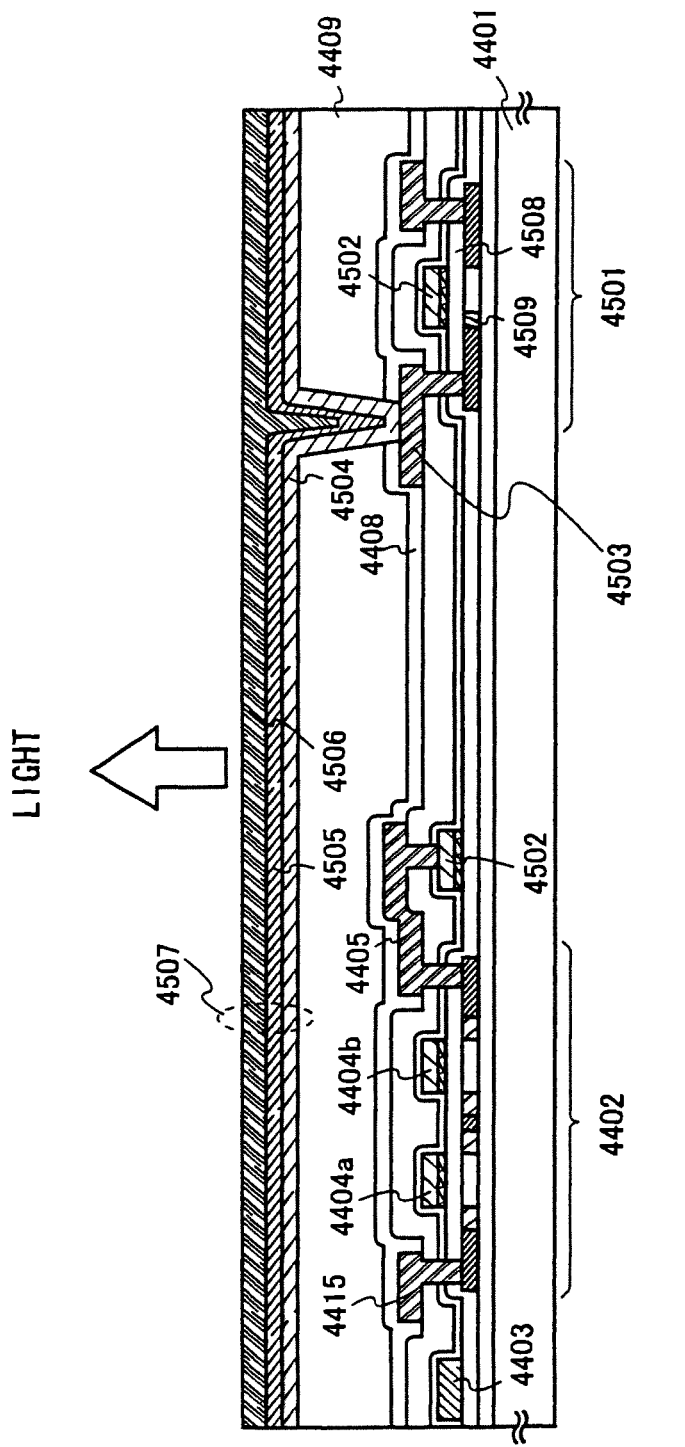
FIG. 17 is a figure showing a cross section of an EL display device.

In embodiment 17 an EL display device comprising a pixel structure differing from embodiment 16 is described. FIG. 17 is used for explanation. Note that the description of embodiment 16 may be referred regarding parts where the same reference numerals as FIG. 15 are given.

In FIG. 17 a TFT having the same structure as n-channel TFT 302 of FIG. 4B as current control TFT 4501. Needless to say, gate electrode 4502 of current control TFT 4501 is connected to drain wiring 4405 of switching TFT 4402. Drain wiring 4503 of current control TFT 4501 is electrically connected to pixel electrode 4504.

In embodiment 17 pixel electrode 4504 is formed by using a conductive film having light shielding property, and functions as a cathode of EL element. An alloy film of aluminum and lithium is used in concrete, but a conductive film comprising an element belonging to periodic table group 1 or 2, or a conductive film added with such element may be used here.

EL film 4505 is formed on top of pixel electrode 4504. Note that though FIG. 17 shows only 1 pixel, EL layer corresponding to G (green) is formed in embodiment 15 by evaporation method or coating method (preferably spin coating). In concrete, it is a laminate structure comprising a lithium fluoride (LiF) film of 20 nm thickness provided as electron injection layer and a PPV (poly-p-phenylene vinylene) of 70 nm thickness provided thereon as luminescence layer.

An anode 4506 comprising transparent conductive film is next disposed on EL layer 4505. In embodiment 17, a compound comprising indium oxide and tin oxide or a compound comprising indium oxide and zinc oxide is used.

On completing formation of anode 4506, an EL element 4507 is finished. Note that EL element 4507 represents here a capacitor formed from pixel electrode (cathode) 4504, EL layer 4505 and anode 4506.

Here that current control TFT 4501 has a structure of present invention has a very important meaning. Since current control TFT 4501 is an element for controlling current amount that flow in EL element 4507, a lot of current flow there and the element has a great danger of deterioration by heat or hot carriers. The structure of present invention is therefore effective, in which an LDD region 4509 is disposed so as to overlap the gate electrode 4502 by interposing gate insulating film 4508 on the drain side of current control TFT 4501.

In addition, the current control TFT 4501 of embodiment 17 forms a parasitic capacitance, which is referred to as gate capacitor, in between gate electrode 4502 and LDD region 4509. It is possible to provide the same function as storage capacitor 4418 shown in FIGS. 16A and 16B by adjusting this gate capacitor. Specifically in case of driving the EL display device by digital driving method, it is possible to use the gate capacitor for storage capacitor because the capacitance of storage capacitor is small compared to the case of driving by analog driving method.

Note that in fabrication of EL display device of embodiment 17 the structures of embodiments 1 to 11 and 13 to 15 may freely be combined.

Embodiment 18

Figure 18A:
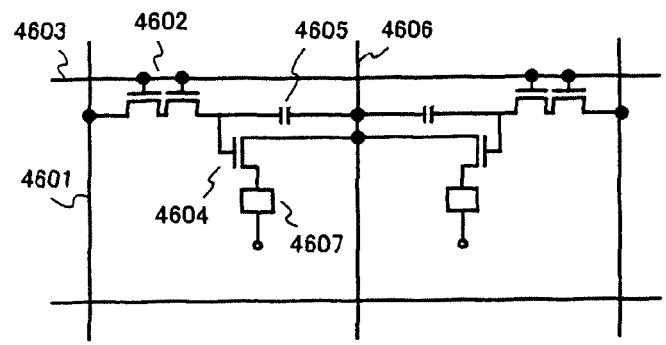
FIGS. 18A to 18C are figures showing circuit structure of pixel section of an EL display device.
Figure 18B:
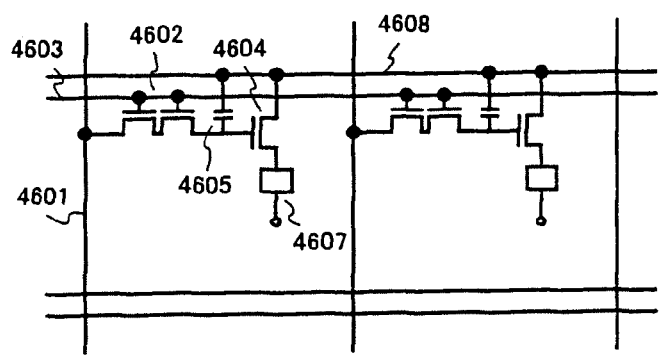
Figure 18C:
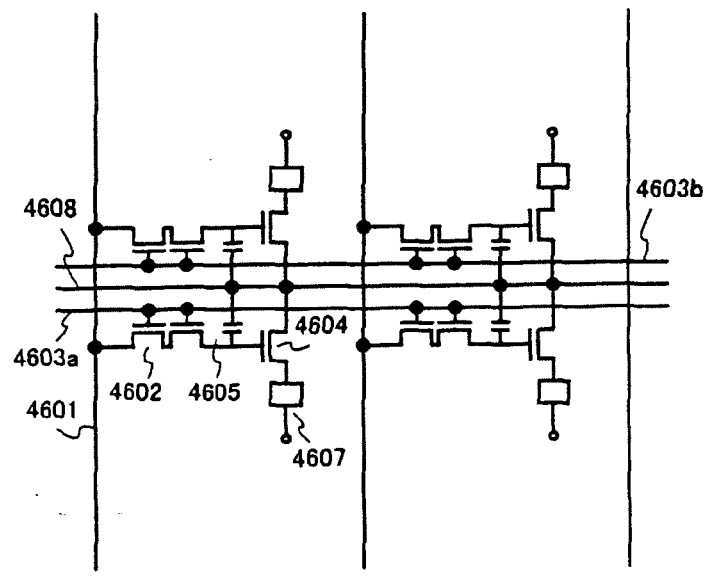

In embodiment 18, examples of pixel structures that can be used for pixel section of EL display device shown in Embodiments 16 and 17 are shown in FIGS. 18A to 18C. Note that in embodiment 16, reference numeral 4601 denotes a source wiring of a switching TFT 4602, 4603a and 4603b denotes a gate wiring of the switching TFT 4602, 4604 denotes a current control TFT, 4605 denotes a capacitor, 4606 and 4608 denote current supply lines, and 4607 denotes an EL element.

FIG. 18A is an example of a case in which the current supply line 4606 is shared between two pixels. Namely, this is characterized in that two pixels are formed having linear symmetry around the current supply line 4606. In this case the number of power supply lines can be reduced, so the pixel section can be made higher definition.

FIG. 18B is an example of a case in which the current supply line 4608 is formed parallel to the gate wiring 4603a and 4603b. Note that FIG. 18B has a structure in which the current supply line 4608 and the gate wiring 4603a and 4603b are formed so as not to overlap. However in case these are wirings formed on different layers, they can be provided so as to overlap by interposing an insulating film. In this case, the area used exclusively by the current supply line 4608 and the gate wiring 4603a and 4603b can be shared, so the pixel section can be made even higher definition.

Furthermore, FIG. 18C is characterized in that the current supply line 4608 is formed parallel to gate wiring 4603a and 4603b, similar to the structure of FIG. 18B, and in addition, two pixels are formed to have linear symmetry around the current supply line 4608. It is also effective to form the current supply line 4608 to overlap one of gate wiring 4603a or 4603b. In this case the number of power supply lines can be reduced, so the pixel section can be made higher definition.

Embodiment 19

Electrooptical device or semiconductor circuit formed in accordance with the present invention can be used as display section or signal processing circuit of electric machines. The following can be given as examples of this type of electric machines: video cameras; digital cameras; projectors; projection TVs; goggle type displays (head mounted displays); navigation systems; sound reproduction devices; notebook type personal computers; game machines; portable information terminals (such as mobile computers, portable telephones, portable game machines or electronic notebook etc.); image reproduction devices having recording media; etc. Some examples of these are shown in FIGS. 19A to 19F, 20A to 20D and 21A to 21B.

FIG. 19A is a portable telephone, and comprises a main body 2001, a voice output section 2002, a voice input section 2003, a display section 2004, operation switches 2005, and an antenna 2006 etc. The electrooptical device of the present invention can be applied to the display section 2004, and semiconductor circuit of the present invention can be applied to the voice output section 2002, to the voice input section 2003, and to CPU or memory etc.

FIG. 19B is a video camera, and comprises a main body 2101, a display section 2102, a voice input section 2103, operation switches 2104, a battery 2105, and an image receiving section 2106. The electrooptical device of the present invention can be applied to the display section 2102 and semiconductor circuit of the present invention can be used for voice input section 2103, CPU or memory etc.

FIG. 19C is a mobile computer, and comprises a main body 2201, a camera section 2202, an image receiving section 2203, operation switches 2204, and a display section 2205. The electrooptical device of the present invention can be applied to the display section 2205 and semiconductor circuit of the present invention can be used for CPU or memory etc.

FIG. 19D is a goggle type display, and comprises a main body 2301, display section 2302, and arm sections 2303. The electrooptical device of the present invention can be applied to the display section 2302 and semiconductor circuit of the present invention can be used for CPU or memory etc.

FIG. 19E is a rear type projector (projection TV), and comprises a main body 2401, a light source 2402, liquid crystal display device 2403, polarizing beam splitter 2404, reflectors 2405 and 2406, a screen 2407. The present invention can be applied to the liquid crystal display device 2403 and semiconductor circuit of the present invention can be used for CPU or memory etc.

FIG. 19F is a front type projector, and comprises a main body 2501, a light source 2502, a liquid crystal display device 2503, an optical system 2504 and a screen 2505. The present invention can be applied to the liquid crystal display device 2503 and semiconductor circuit of the present invention can be used for CPU or memory etc.

Figure 20A:
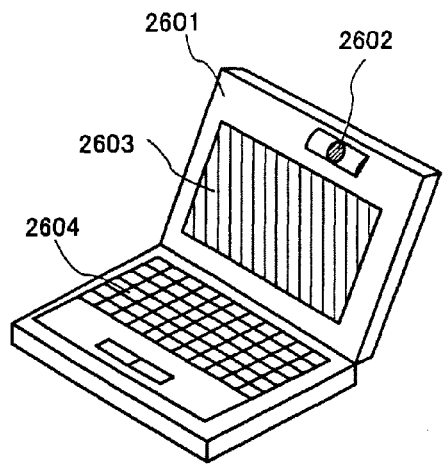
FIGS. 20A to 20D are examples of electronic devices.

FIG. 20A is a personal computer, and comprises a main body 2601, an image input section 2602, a display section 2603, and a keyboard 2604. The electrooptical device of the present invention can be applied to the display section 2603 and semiconductor circuit of the present invention can be used for CPU or memory etc.

Figure 20B:
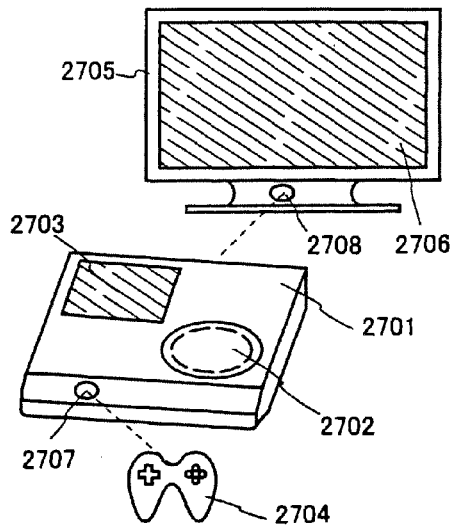

FIG. 20B is an electronic game machine and comprises a main body 2701, a recording medium 2702, a display section 2703 and a controller 2704. Voice or image outputted from this electronic game machine is reproduced by a display comprising an exterior cover 2705 and display section 2706. Wire communication, wireless communication or optical communication may be used as a communication means between controller 2704 and main body 2701 or between electronic game machine and display. In embodiment 17, the structure in which infrared radiation is detected by sensors 2707 and 2708 is employed.

Figure 20C:
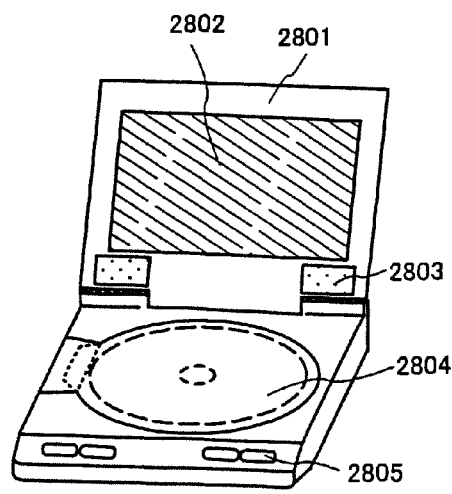

FIG. 20C is a player that uses a recording medium on which a program is recorded (hereinafter referred to as a recording medium), and comprises a main body 2801, a display section 2802, a speaker section 2803, a recording medium 2804, and operation switches 2805. Note that music appreciation, film appreciation, games, and the use of the Internet can be performed with this device using a DVD (digital versatile disk), a CD, etc., as a recording medium. The electrooptical device of the present invention can be applied to the display section 2802 and semiconductor circuit of the present invention can be used for CPU or memory etc.

Figure 20D:
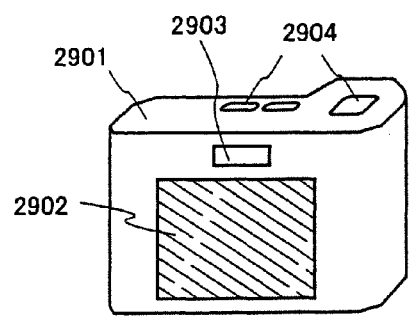

FIG. 20D is a digital camera, and comprises a main body 2901, a display device 2902, a viewfinder 2903, operation switches 2904, and an image receiving section (not shown in the figure). The electrooptical device of the present invention can be applied to the display section 2902 and semiconductor circuit of the present invention can be used for CPU or memory etc.

Figure 21A:
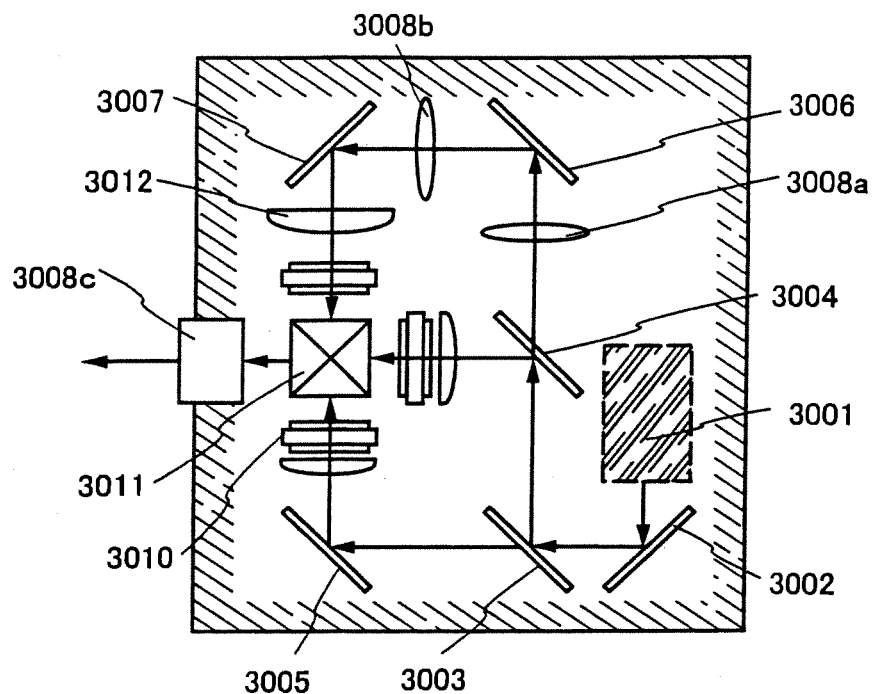
FIGS. 21A and 21B are figures showing structures of an optical engine and a light source optical system, respectively.

The optical engine shown in FIG. 21A comprises an optical light source system 3001, mirrors 3002 and 3005 to 3007, dichroic mirrors 3003 and 3004, optical lenses 3008a to 3008c, a prism 3011, a liquid crystal display device 3010, and an optical projection system 3012. The optical projection system 3012 is an optical system provided with a projection lens. Embodiment 17 shows an example of triple stage, but there are no special limits and a single stage is acceptable, for example. Further, the operator may set optical systems such as optical lenses, film having polarizing function, film to regulate the phase difference, IR films, etc., suitably within the optical path shown by an arrow in FIG. 21A.

Figure 21B:
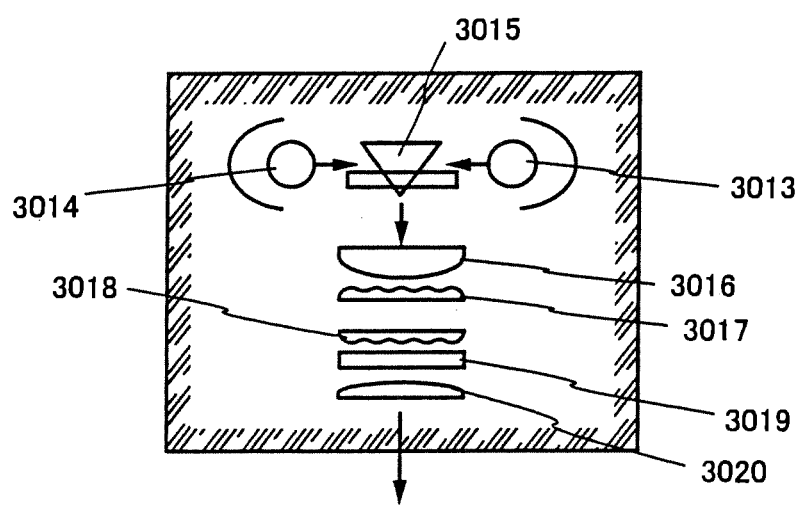

As shown in FIG. 21B, the optical light source system 3001 comprises light sources 3013 and 3014, composing prism 3015, collimator lenses 3016 and 3020, lens arrays 3017 and 3018, polarizing conversion element 3019. Note that the optical light source shown in FIG. 21B used 2 light sources, but it may be 1 or 3 or more. Further, it is acceptable to suitably place optical lenses, film having polarizing function, film to regulate the phase difference, IR films, etc.

As shown above, the applicable range of the present invention is very large, an it is possible to apply to electric machines of various area. Further, the electric machine of embodiment 19 can be realized by utilizing structures of any combination of embodiments 1 to 10, and 13 to 18.

By using the present invention, it becomes possible to dispose circuits having appropriate performance corresponding to specification required by the circuit over a substrate. The operation performance and reliability of an electrooptical device can be greatly improved.

Further, a storage capacitor having a large capacity in a small area can be formed in the pixel section of an electrooptical device typified by a liquid crystal display device. Accordingly, it is possible to keep a sufficient storage capacitor without decreasing aperture ratio (portion of effective display area against pixel area).

Moreover, the operation performance and reliability of electric machines having such electrooptical device as a display section.

CHART 1

| Metal Material | Thickness (nm) | Sheet Resistance ($\Omega/\square$) |
|---|---|---|
| TaN/Ta | 50/350 | 1.58 |
| W | 400 | 0.36 |
| Al—Nd | 250 | 0.19 |

CHART 1-continued

| Metal Material | Thickness (nm) | Sheet Resistance (Ω/□) |
|---|---|---|
| TaN/Ta + Al—Nd | 50/350 + 250 | 0.16 |
| W + Al—Nd | 400 + 250 | 0.12 |

What is claimed is:

1. A display device comprising:
   a transistor over a substrate, and comprising a gate electrode and a gate insulating film;
   a capacitor over the substrate, and comprising:
      a first layer comprising a same material of the gate electrode;
      a second layer comprising a first semiconductor film, wherein the first semiconductor film is electrically connected to a current supply line; and
      a third layer between the first layer and the second layer, wherein the third layer is a same layer as the gate insulating film,
   a first insulating film over the transistor and the capacitor;
   an EL element over the first insulating film, and electrically connected to the transistor, the EL element comprising:
      a first electrode provided over the first insulating film and electrically connected to the transistor;
      an EL layer formed over the first electrode, the EL layer comprising an organic material; and
      a second electrode formed over the EL layer so that the EL layer is interposed between the first and second electrodes;
   a cover material covering the EL element,
   wherein a gap between the EL element and the cover material is filled with a filler whereby the EL element is covered by the filler.

2. A display device comprising:
   a transistor over a substrate, and comprising a gate electrode and a gate insulating film;
   a capacitor over the substrate, and comprising:
      a first layer comprising a same material of the gate electrode;
      a second layer comprising a first semiconductor film, wherein the first semiconductor film is electrically connected to a current supply line; and
      a third layer between the first layer and the second layer, wherein the third layer is a same layer as the gate insulating film,
   a first insulating film over the transistor and the capacitor;
   a source wiring over the first insulating film, and comprising a first titanium film, an aluminum film, and a second titanium film;
   a second insulating film over the source wiring;
   an EL element over the first insulating film, and electrically connected to the transistor, the EL element comprising:
      a first electrode provided over the second insulating film and electrically connected to the transistor;
      an EL layer formed over the first electrode, the EL layer comprising an organic material; and
      a second electrode formed over the EL layer so that the EL layer is interposed between the first and second electrodes;
   a cover material covering the EL element,
   wherein a gap between the EL element and the cover material is filled with a filler whereby the EL element is covered by the filler.

3. A display device comprising:
   a transistor over a substrate, and comprising a gate electrode and a gate insulating film;
   a capacitor over the substrate, and comprising:
      a first layer comprising a same material of the gate electrode;
      a second layer comprising a first semiconductor film, wherein the first semiconductor film is electrically connected to a current supply line; and
      a third layer between the first layer and the second layer, wherein the third layer is a same layer as the gate insulating film,
   a first insulating film over the transistor and the capacitor, and comprising a laminate of a silicon nitride film and a silicon oxide film;
   a second insulating film over the first insulating film, and comprising an organic resin;
   an EL element over the second insulating film, and electrically connected to the transistor, the EL element comprising:
      a first electrode provided over the second insulating film and electrically connected to the transistor;
      an EL layer formed over the first electrode, the EL layer comprising an organic material; and
      a second electrode formed over the EL layer so that the EL layer is interposed between the first and second electrodes;
   a cover material covering the EL element,
   wherein a gap between the EL element and the cover material is filled with a filler whereby the EL element is covered by the filler.

4. A display device according to claim 1, further comprising a gate wiring comprising a first wiring and a second wiring over the first wiring, wherein the first wiring comprising the same material of the gate electrode.

5. A display device according to claim 2, further comprising a gate wiring comprising a first wiring and a second wiring over the first wiring, wherein the first wiring comprising the same material of the gate electrode.

6. A display device according to claim 3, further comprising a gate wiring comprising a first wiring and a second wiring over the first wiring, wherein the first wiring comprising the same material of the gate electrode.

7. A display device according to claim 1, wherein the transistor further comprises a second semiconductor film below the gate electrode.

8. A display device according to claim 2, wherein the transistor further comprises a second semiconductor film below the gate electrode.

9. A display device according to claim 3, wherein the transistor further comprises a second semiconductor film below the gate electrode.

10. A display device according to claim 7, wherein the first semiconductor film and the second semiconductor film are electrically connected with each other, and are separated from each other with a gap.

11. A display device according to claim 8, wherein the first semiconductor film and the second semiconductor film are electrically connected with each other, and are separated from each other with a gap.

12. A display device according to claim 9, wherein the first semiconductor film and the second semiconductor film are electrically connected with each other, and are separated from each other with a gap.

13. A display device according to claim 1, further comprising a driver circuit over the substrate.

14. A display device according to claim 2, further comprising a driver circuit over the substrate.

15. A display device according to claim 3, further comprising a driver circuit over the substrate.

16. A display device according to claim 1, wherein the filler is a material selected from the group consisting of a ultraviolet ray curing resin, a thermosetting resin, polyvinylchloride, acrylic, polyimide, epoxy resin, silicone resin, polyvinyl butyral, and ethylene vinyl acetate.

17. A display device according to claim 1, wherein the filler is a material selected from the group consisting of a ultraviolet ray curing resin, a thermosetting resin, polyvinylchloride, acrylic, polyimide, epoxy resin, silicone resin, polyvinyl butyral, and ethylene vinyl acetate.

18. A display device according to claim 1, wherein the filler is a material selected from the group consisting of a ultraviolet ray curing resin, a thermosetting resin, polyvinylchloride, acrylic, polyimide, epoxy resin, silicone resin, polyvinyl butyral, and ethylene vinyl acetate.

19. A display device according to claim 1, wherein the gate electrode comprises at least one material selected from the group consisting of tantalum, titanium, molybdenum, tungsten, chromium, niobium and silicon.

20. A display device according to claim 2, wherein the gate electrode comprises at least one material selected from the group consisting of tantalum, titanium, molybdenum, tungsten, chromium, niobium and silicon.

21. A display device according to claim 3, wherein the gate electrode comprises at least one material selected from the group consisting of tantalum, titanium, molybdenum, tungsten, chromium, niobium and silicon.

22. A display device according to claim 1, wherein the first layer is provided over the second layer.

23. A display device according to claim 2, wherein the first layer is provided over the second layer.

24. A display device according to claim 3, wherein the first layer is provided over the second layer.

* * * * *